United States Patent
Terada et al.

(10) Patent No.: US 10,199,386 B2
(45) Date of Patent: Feb. 5, 2019

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventors: Takashi Terada, Yokkaichi (JP); Hisashi Kato, Mie (JP); Noriaki Koyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 194 days.

(21) Appl. No.: 15/049,279

(22) Filed: Feb. 22, 2016

(65) Prior Publication Data

US 2017/0025423 A1    Jan. 26, 2017

Related U.S. Application Data

(60) Provisional application No. 62/195,884, filed on Jul. 23, 2015.

(51) Int. Cl.
| | |
|---|---|
| *H01L 29/76* | (2006.01) |
| *H01L 29/792* | (2006.01) |
| *H01L 21/336* | (2006.01) |
| *H01L 27/1157* | (2017.01) |
| *H01L 27/11573* | (2017.01) |
| *H01L 27/11575* | (2017.01) |
| *H01L 27/11582* | (2017.01) |

(52) U.S. Cl.
CPC .... *H01L 27/1157* (2013.01); *H01L 27/11573* (2013.01); *H01L 27/11575* (2013.01); *H01L 27/11582* (2013.01)

(58) Field of Classification Search
CPC ......... H01L 27/11582; H01L 27/11575; H01L 27/11573; H01L 27/11556; H01L 27/11578; H01L 27/11548; H01L 27/11551
USPC .......... 257/324, 314, E29.309; 438/257, 268
See application file for complete search history.

(56) References Cited

U.S. PATENT DOCUMENTS

| | | | |
|---|---|---|---|
| 8,680,604 B2 | 3/2014 | Higashi et al. | |
| 8,822,285 B2 | 9/2014 | Hwang et al. | |
| 9,236,392 B1* | 1/2016 | Izumi | H01L 27/11573 |
| 2010/0109071 A1* | 5/2010 | Tanaka | H01L 27/11578 257/324 |
| 2012/0168858 A1 | 7/2012 | Hong | |
| 2012/0238093 A1* | 9/2012 | Park | H01L 21/76838 438/675 |

(Continued)

*Primary Examiner* — Fernando L Toledo
*Assistant Examiner* — Aaron Gray
(74) *Attorney, Agent, or Firm* — Oblon, McClelland, Maier & Neustadt, L.L.P.

(57) ABSTRACT

According to one embodiment, a semiconductor memory device includes a substrate; a first stacked body; a second stacked body being larger in number of stacked layers than the first stacked body, the second stacked body including a plurality of electrode layers separately stacked each other; a third stacked body being smaller in number of stacked layers than the first stacked body. The first stacked body includes a plurality of first layers separately stacked each other, and a plurality of second layers provided between the first layers. The third stacked body includes a third layer including a same material as the material of the first layers, and a fourth layer including a same material as the material of the second layers.

19 Claims, 20 Drawing Sheets

(56) References Cited

U.S. PATENT DOCUMENTS

2014/0054787 A1\* 2/2014 Eun .................. H01L 27/11548
257/773
2016/0064281 A1\* 3/2016 Izumi ................ H01L 21/76816
257/315
2016/0315096 A1\* 10/2016 Imamura ........... H01L 27/11582

\* cited by examiner

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/195,884 field on Jul. 23, 2015; the entire contents of which are incorporated herein by reference.

FIELD

Embodiments described herein relate generally to a semiconductor memory device and a method for manufacturing same.

BACKGROUND

There is a stacked semiconductor memory device including memory cells that are three-dimensionally disposed for increasing the degree of integration of memory. The semiconductor memory device includes a plurality of channel bodies extending in a stacking direction and a plurality of electrode layers that extend in a direction intersecting the stacking direction and are arranged in the stacking direction. A plurality of memory cells are formed between the channel bodies and the electrode layers. A peripheral circuit, a scribe line and an intermediate portion are provided in a periphery of the stacked body forming the memory cells.

DETAILED DESCRIPTION

Figure 1A:
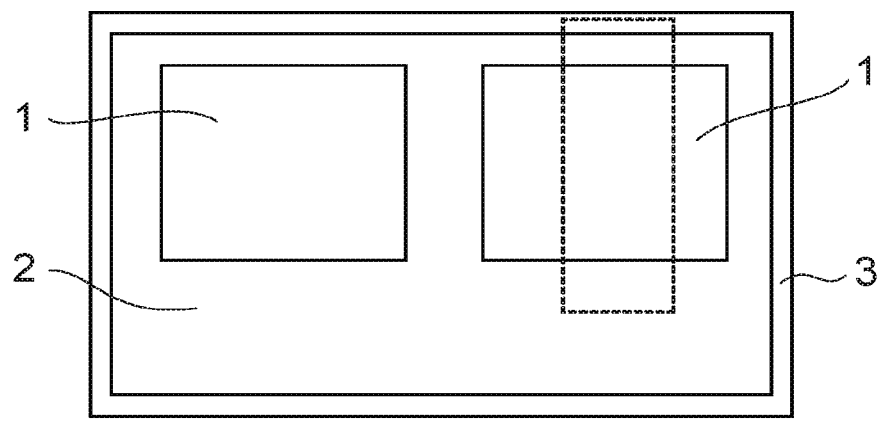
FIG. 1A is a block diagram showing a configuration of the semiconductor memory device of a first embodiment.

According to one embodiment, a semiconductor memory device includes a substrate; a first stacked body provided on the substrate; a second stacked body provided on the substrate, and being larger in number of stacked layers than the first stacked body, the second stacked body including a plurality of electrode layers separately stacked each other; a third stacked body provided between the first stacked body and the second stacked body, and being smaller in number of stacked layers than the first stacked body. The first stacked body includes a plurality of first layers separately stacked each other, and a plurality of second layers provided between the first layers. The third stacked body includes a third layer including a same material as the material of the first layers, and a fourth layer including a same material as the material of the second layers.

Hereinafter, embodiments will be described with reference to the drawings. In the drawings, the same elements are denoted by the same reference sign.

(First Embodiment)

An example of a configuration of a semiconductor memory device according to the embodiment will be described with reference to FIGS. 1A through 3.

Figure 1B:
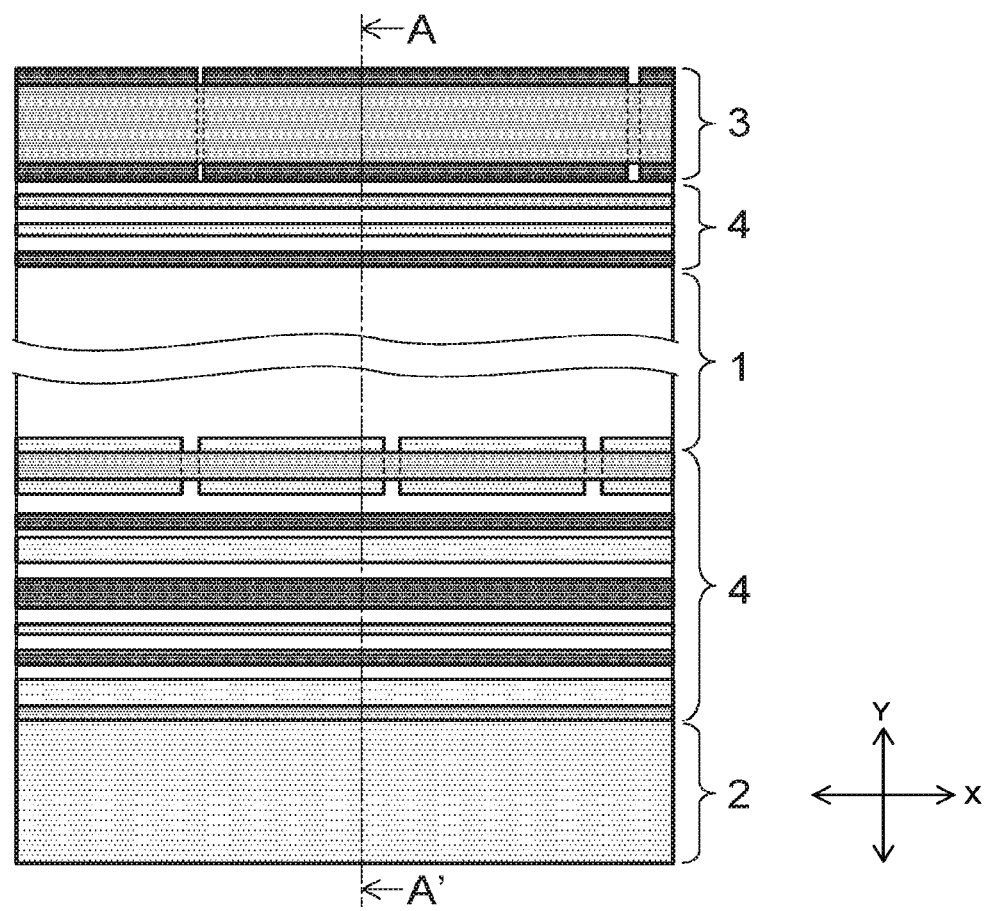
FIG. 1B is an enlarged block diagram showing a configuration of the semiconductor memory device of the first embodiment.

FIG. 1A is a block diagram showing a configuration of the semiconductor memory device according to the embodiment, and FIG. 1B is an enlarged block diagram of the dotted line part in FIG. 1A.

Figure 2:
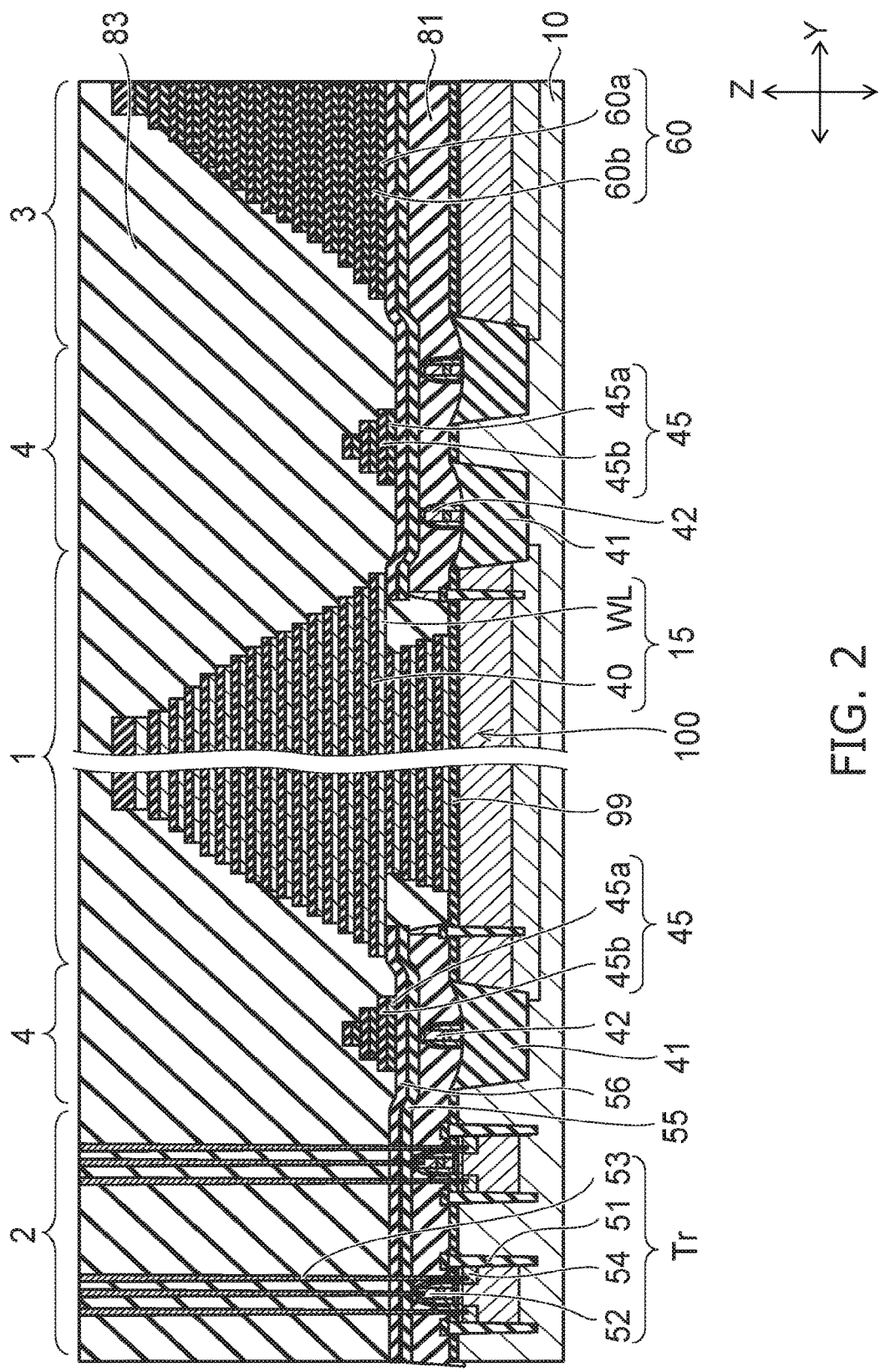
FIG. 2 is a schematic cross-sectional view of the semiconductor memory device of the first embodiment.

FIG. 2 is a schematic cross-sectional view corresponding to the line A-A' shown in FIG. 1B. It should be noted that in FIG. 2, graphical description of configurations located on a stacked body 15 is omitted.

Figure 3:
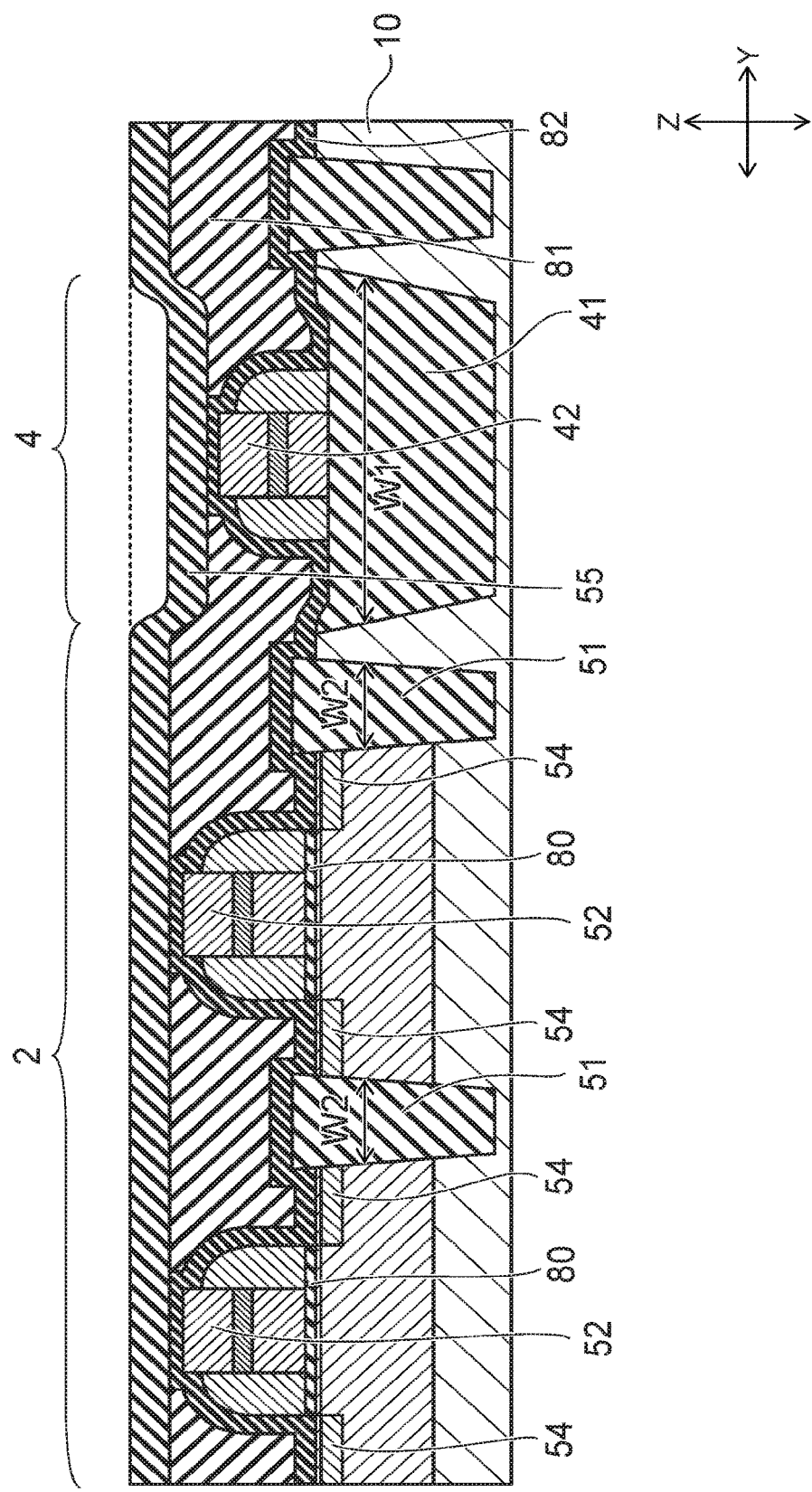
FIG. 3 is an enlarged schematic cross-sectional view of a part of the semiconductor memory device of the first embodiment.

FIG. 3 is an enlarged schematic cross-sectional view of a part of a peripheral circuit 2 and an intermediate portion 4. It should be noted that configurations such as transistors Tr are partially omitted.

In FIGS. 1B and 2, the direction of the line A-A' is defined as a Y-direction, a direction perpendicular to the Y-direction is defined as an X-direction, and a stacking direction of each of the stacked bodies 15, 45, and 60 perpendicular to the X-direction and the Y-direction (an X-Y plane) is defined as a Z-direction.

As shown in FIG. 1A, the semiconductor memory device according to the embodiment includes memory cell portions 1, the peripheral circuit 2, and a scribe line 3. The memory cell portions 1 are surrounded by the scribe line 3. The peripheral circuit 2 is provided between the memory cell portions 1 and the scribe line 3.

The plan view shown in FIG. 1B is a diagram schematically showing a structure on a substrate of the semiconductor memory device according to the embodiment. As shown in FIG. 1B, the semiconductor memory device includes the intermediate portions 4. The intermediate portions 4 are provided between the memory cell portions 1 and the scribe line 3, and between the memory cell portions 1 and the peripheral circuit 2, respectively. The intermediate portions 4 are also provided between the scribe line 3 and the peripheral circuit 2.

As shown in FIG. 2, the memory cell portion 1 is provided with a memory cell array 100. The configuration of the memory cell array 100 will be described later.

The peripheral circuit 2 is provided with the transistors Tr. The transistors Tr each include a gate electrode 52, insulating portions 51 (e.g., shallow trench isolation (STI)), contact portions 53, and semiconductor portions 54.

Figure 6:
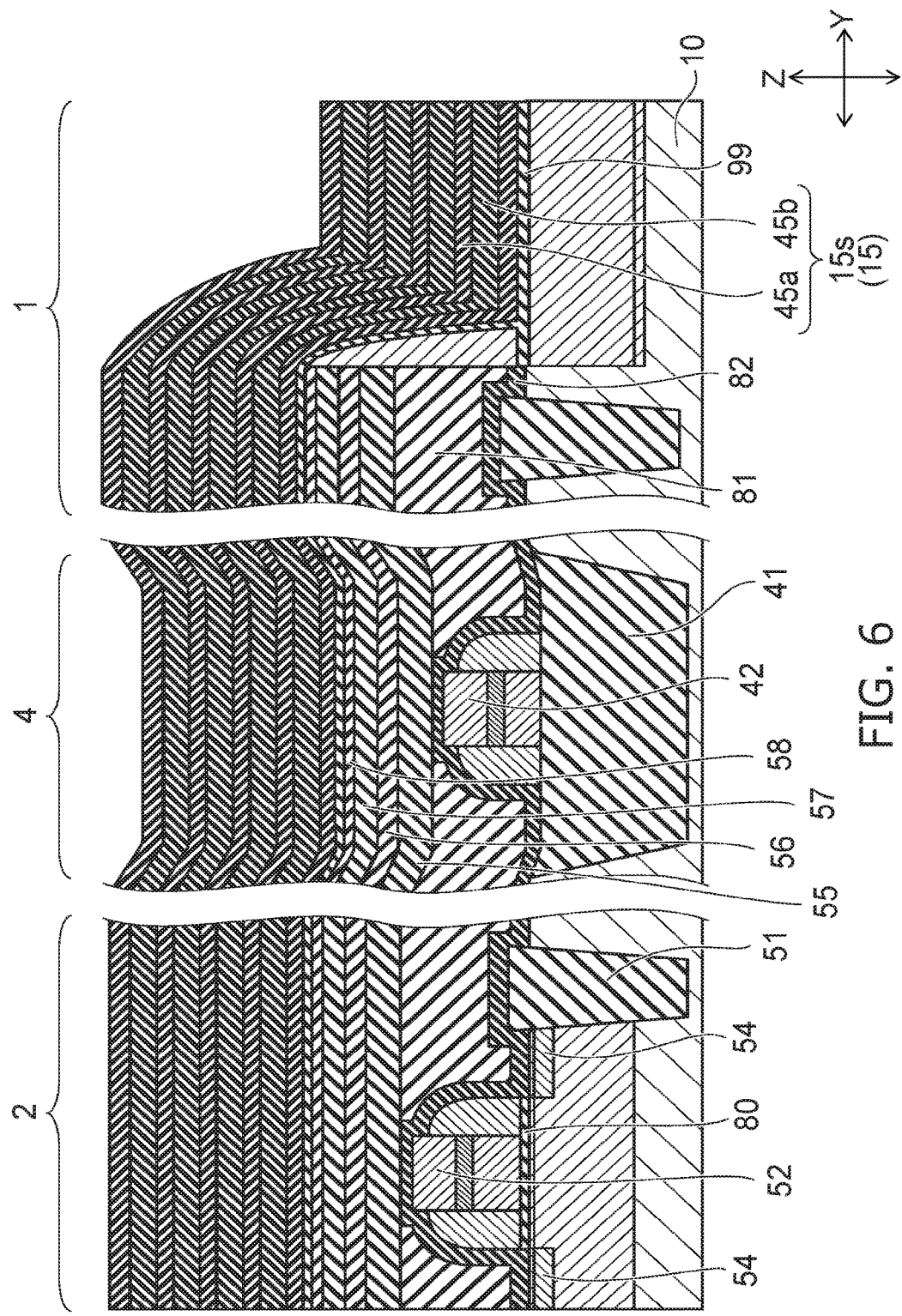
FIG. 6 to FIG. 12 are schematic cross-sectional views showing a method for manufacturing the semiconductor memory device of the first embodiment.

The gate electrode 52 is provided on a substrate 10 via an insulating film 80 (see FIG. 6). A lower surface of the gate electrode 52 is located higher than an upper surface of the substrate 10 in a part where the transistor Tr is not provided.

The semiconductor portions 54 are provided on the substrate 10, and are adjacent to the gate electrode 52. The gate electrode 52 is sandwiched by the pair of semiconductor portions 54.

The insulating portions 51 are provided on the substrate 10, and are adjacent to the gate electrode 52 via the semiconductor portions 54. The height of upper surfaces of the insulating portions 51 is equal to or higher than the height of the upper surface of the substrate 10 in the part where the transistor Tr is not provided. It should be noted that the "height" here shows the position in the Z-direction.

The lower sides of the contact portions 53 have contact with either of the gate electrode 52 and the semiconductor portions 54.

On the gate electrode 52, there are provided insulating films 55, 56. The insulating films 55, 56 extend in the X-Y plane.

In the scribe line 3, there is provided the stacked body 60 (a first stacked body). Specifically, the stacked body 60 is provided so as to overlap the scribe line 3. The stacked body 60 is provided on the substrate 10 via an insulating layer 81 and the insulating films 55, 56.

The stacked body 60 has a plurality of first layers 60a and a plurality of second layers 60b. The first layers 60a are stacked so as to be separated from each other. The second layers 60b are provided between the first layers 60a, respectively.

The number of stacked layers in the stacked body 60 is smaller than the number of stacked layers in the stacked body 15 of the memory cell portion 1. The stacked bodies 15, 60 each have a stairs shape.

In the intermediate portions 4, there are provided insulating portions 41 (first insulating portions), gate electrodes 42, and the stacked bodies 45 (third stacked bodies). The insulating portion 41 is provided on the substrate 10, and extends in the X-direction.

The insulating portion 41 is provided on the substrate 10. The gate electrode 42 is provided on the insulating portion 41. The gate electrode 42 is not electrically connected to, for example, the outside. In other words, the gate electrode 42 is provided as, for example, a dummy portion.

On the gate electrode 42, there are provided the insulating films 55, 56. The insulating films 55, 56 are integrally provided from the peripheral circuit 2 to the intermediate portion 4. Each of the insulating films 55, 56 can be provided integrally, for example. The stacked body 45 is provided on the gate electrode 42 via the insulating films 55, 56. The stacked body 45 has a plurality of third layers 45a and a plurality of fourth layers 45b. The third layers 45a are separately stacked each other. The fourth layers 45b are provided between the third layers 45a, respectively. The number of the third layers 45a and the fourth layers 45b stacked is arbitrary.

The number of stacked layers in the stacked body 45 is smaller than the number of stacked layers in the stacked body 15 of the memory cell portion 1 and the number of stacked layers in the stacked body 60 of the scribe line 3. The stacked body 45 has a structure formed of, for example, one third layer 45a and one fourth layer 45b. In this case, the third layer 45a is provided between the fourth layer 45b and the substrate 10. The stacked body 45 has, for example, a structure formed of two through four third layers 45a and two through four fourth layers 45b.

An upper surface of the stacked body 45 is located higher than an upper surface of the insulating film 56 of the peripheral circuit 2. A lower surface of the stacked body 45 is located lower than a lower surface of the stacked body 60, higher than a lower surface of the stacked body 15, and higher than an upper surface of the gate electrode 52.

The third layers 45a each include, for example, the same material as that of the first layer 60a, and the fourth layers 45b each include, for example, the same material as that of the second layer 60b. The third layers 45a and the first layers 60a each include, for example, a silicon nitride film. The fourth layers 45b and the second layers 60b each include, for example, a silicon oxide film.

The stacked body 45 has a stairs shape. On the stacked bodies 45, there is provided an insulating layer 83. The insulating layer 83 is also provided on the stacked body 15 of the memory cell portion 1, the insulating film 56 of the peripheral circuit 2, and the stacked body 60 of the scribe line 3. An upper surface of the insulating layer 83 located on the stacked bodies 45 and the upper surface of the insulating layer 83 located on the stacked body 15, the insulating film 55, and the stacked body 60 are coplanar with each other, and are integrally provided.

As shown in FIG. 3, in the Y-direction (a first direction), the width W1 of the insulating portion 41 is larger than the width W2 of the insulating portion 51. In the Y-direction, the width W1 of the insulating portion 41 is larger than the width of the gate electrode 42. An upper surface of a planar part of the insulating portion 41 is located lower than an upper surface of the insulating portion 51. An upper surface of the gate electrode 42 is located lower than an upper surface of the gate electrode 52.

An upper surface of the insulating film 55 provided on the peripheral circuit 2 is located higher than the upper surface of the insulating film 55 provided in the intermediate portions 4.

An example of a configuration of the memory cell array 100 according to the embodiment will be described with reference to FIG. 4.

Figure 4:
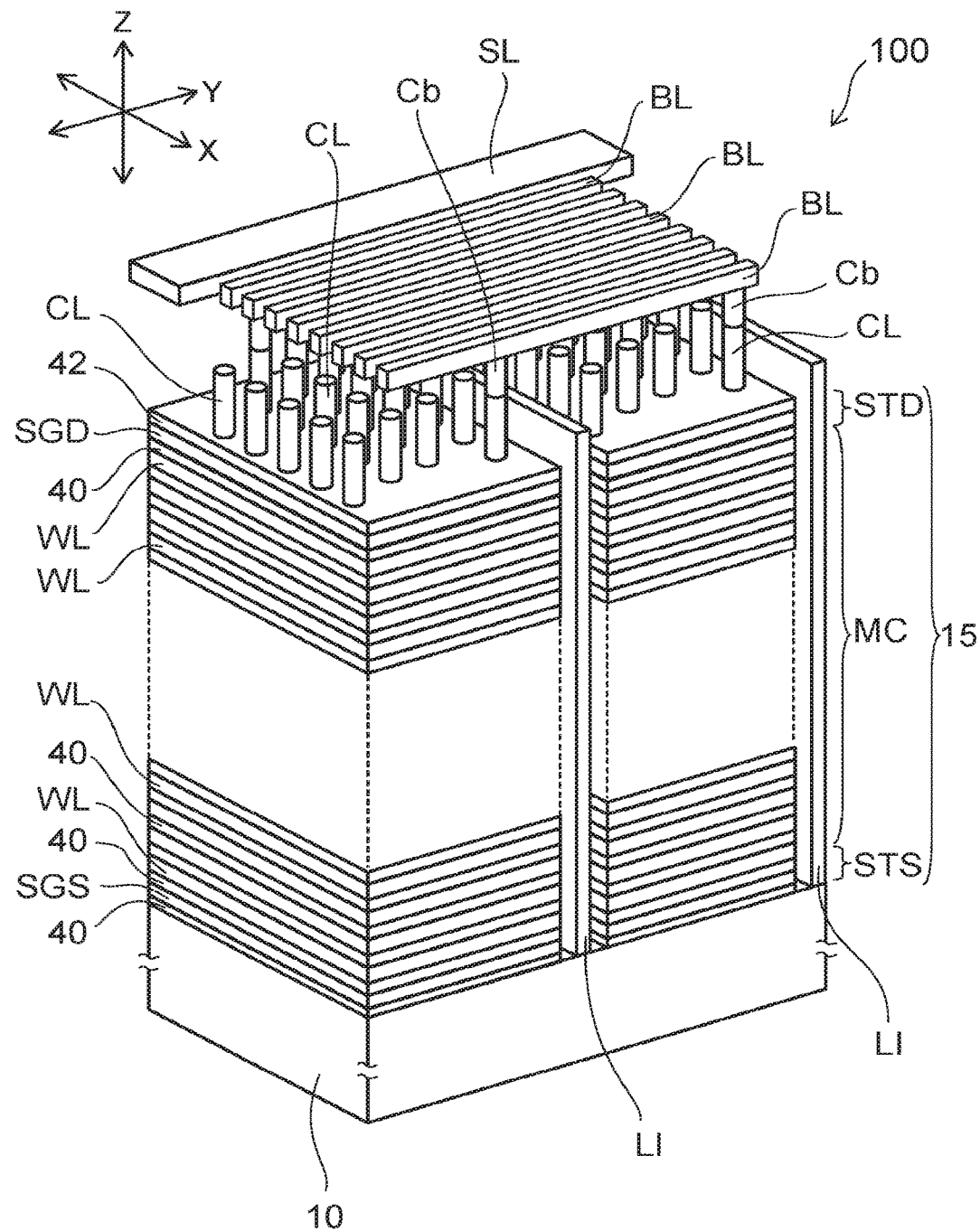
FIG. 4 is a schematic perspective view of a memory cell array of the first embodiment.

FIG. 4 is a schematic perspective view of the memory cell array 100 according to the embodiment. It should be noted that in FIG. 4, in order to make the drawing eye-friendly, the graphical descriptions of the insulating portions between electrode layers and so on are omitted. Further, the memory cell portion 1 shown in FIG. 2 shows an end portion of the memory cell array 100 shown in FIG. 4.

As shown in FIG. 4, the memory cell array 100 includes the stacked body 15 (a second stacked body), a plurality of columnar portions CL, dummy portions LI, and upper layer interconnect. FIG. 4 shows bit lines BL and a source layer SL as the upper layer interconnect.

On the substrate 10, there is provided the stacked body 15. The stacked body 15 includes a source-side select gate SGS, a drain-side select gate SGD, a plurality of electrode layers WL, and a plurality of insulating portions 40.

The source-side select gate SGS is provided as the lowermost layer of the stacked body 15. The drain-side select gate SGD is provided as the uppermost layer of the stacked body 15.

The electrode layers WL are separately stacked each other. Between the electrode layers WL, there are respectively provided the insulating portions 40 each including, for example, an air gap. It should be noted that the number of stacked layers as the electrode layers WL shown in the drawing is illustrative only, and the number of stacked layers as the electrode layers WL is arbitrary.

The electrode layers WL each include metal. The electrode layers WL each include at least one of, for example, tungsten, molybdenum, titanium nitride, and tungsten nitride, and can also include silicon or metal silicide. The source-side select gate SGS and the drain-side select gate SGD each include the same material as those of the electrode layers WL.

The thickness of the drain-side select gate SGD and the thickness of the source-side select gate SGS are larger than the thickness of, for example, one electrode layer WL, and a plurality of such layers can also be provided. It should be noted that the thickness of the drain-side select gate SGD and the thickness of the source-side select gate SGS can also be equal to or smaller than the thickness of one electrode layer WL, and in such a case, a plurality of such layers can also be provided similarly to the case described above. It should be noted that the "thickness" here shows the thickness in the stacking direction (the Z-direction) of the stacked body 15.

In the stacked body 15, there are provided the columnar portions CL each extending in the Z-direction. The columnar portions CL each provided so as to have, for example, a circular cylindrical shape or an elliptic cylindrical shape. The plurality of columnar portions CL are arranged to form, for example, a staggered arrangement. Alternatively, the plurality of columnar portions CL can also be arranged in a square lattice along the X-direction and the Y-direction. The columnar portions CL are electrically connected to the substrate 10.

Figure 5A:
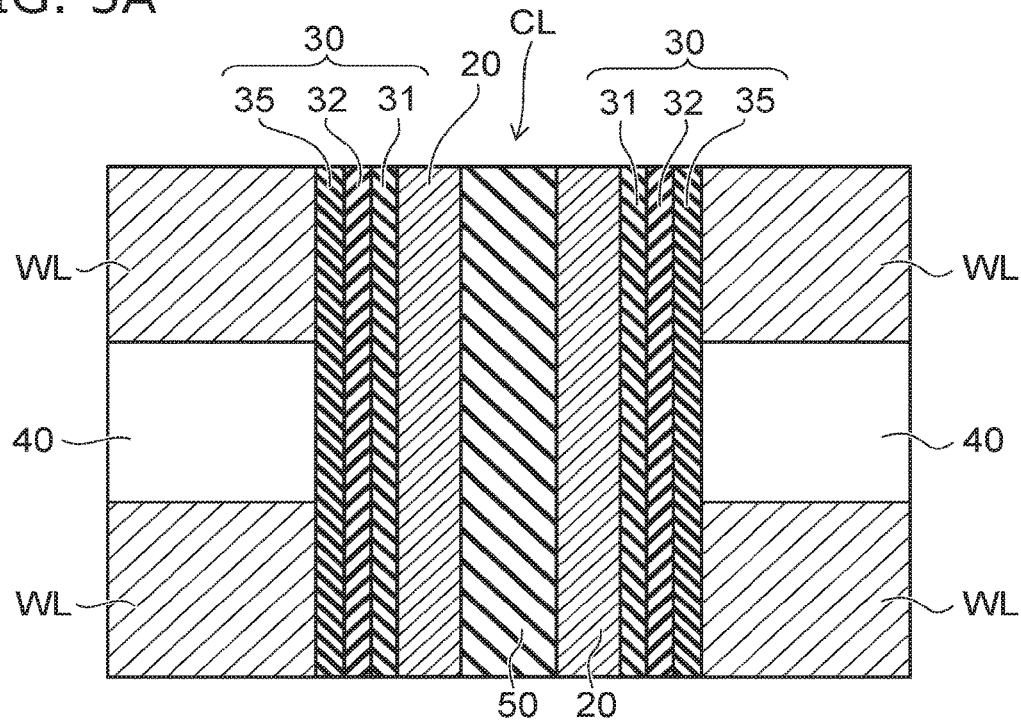
FIG. 5A and FIG. 5B are enlarged schematic cross-sectional views of a part of a columnar portion of the first embodiment.

The columnar portions CL each have a channel body 20, a memory film 30, and a core insulating film 50 shown in FIG. 5A. Between the stacked body 15 and the channel body 20, there is provided the memory film 30. The memory film 30 and the channel body 20 extend in the Z-direction.

Inside the channel body 20, there is provided the core insulating film 50. It should be noted that the channel body 20 can also have, for example, a columnar shape. Inside the channel body 20, it is not required to provide, for example, the core insulating film 50.

The channel body 20 is a silicon film having, for example, silicon as a principal component. The core insulating film 50 includes, for example, a silicon oxide film, and can also include an air gap.

In the stacked body 15, there are provided the dummy portions LI each extending in the X-direction and the Z-direction inside the stacked body 15. The dummy portions LI are sandwiched by the stacked body 15. On a sidewall of each of the dummy portions LI, there is provided an insulating film. Inside the insulating film, there is provided a conductive film. The insulating film and the conductive film extend in the X-direction and the Z-direction similarly to the dummy portions LI.

A lower end of each of the dummy portions LI is electrically connected to the channel body 20 (a semiconductor film) in each of the columnar portions CL via the substrate 10. An upper end of each of the dummy portions LI is electrically connected to the peripheral circuit 2 via a contact portion not shown.

Above the stacked body 15, there is provided the plurality of bit lines BL (e.g., metal films). The bit lines LB are separated from each other in the X-direction, and extend in the Y-direction.

An upper end of each of the channel bodies 20 is connected to the bit line BL (interconnect), and a lower end side of the channel bodies 20 is connected to the substrate 10. The bit lines BL are provided so as to extend in the Y-direction.

The channel bodies 20 of the respective columnar portions CL selected from respective regions separated in the Y-direction via the dummy portion LI are connected to common one of the bit lines BL.

The upper end portions of the columnar portions CL are each provided with a drain-side select transistor STD, and the lower end portions are each provided with a source-side select transistor STS.

A memory cell MC, the drain-side select transistor STD, and the source-side select transistor STS are each a vertical transistor through which a current flows in the stacking direction (the Z-direction) of the stacked body 15.

The select gates SGD, SGS function as gate electrodes (control gates) of the respective select transistors STD, STS. Between each of the select gates SGD, SGS and the channel body 20, there is provided an insulating film functioning as the gate insulating film of each of the select transistors STD, STS.

Between the drain-side select transistor STD and the source-side select transistor STS, there is provided a plurality of memory cells MC having the electrode layers WL of the respective layers as control gates.

The plurality of memory cells MC, the drain-side select transistor STD, and the source-side select transistor STS are connected in series to each other via the channel body 20 to constitute one memory string. The memory strings are provided in directions of a plane parallel to the X-Y plane to form, for example, a staggered arrangement, and thus, the memory cells MC are three-dimensionally provided in the X-direction, Y-direction, and the Z-direction. Specifically, the stacked body 15 is provided so as to overlap the memory cell array 100.

The semiconductor memory device according to the embodiment is capable of electrically and freely performing data erasure and data writing, and holding the storage contents even if the power is cut.

An example of the memory cell MC according to the embodiment will be described with reference to FIGS. 5A and 5B.

Figure 5B:
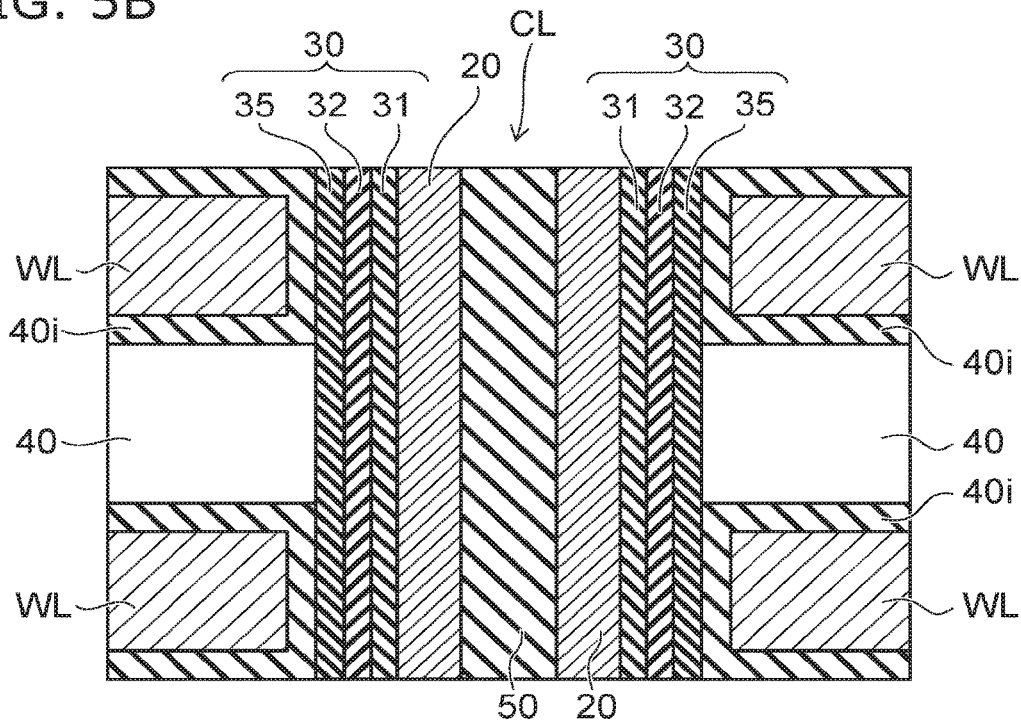

FIGS. 5A and 5B are each an enlarged cross-sectional view of a part of the columnar portion CL of the embodiment.

The memory cell MC is, for example, a charge-trap type, and has the electrode layers WL, the memory film 30, the channel body 20, and the core insulating film 50.

The channel body 20 functions as the channel in the memory cell MC, and the electrode layer WL functions as the control gate of the memory cell MC. A charge storage film 32 functions as a data memory layer for storing the charge injected from the channel body 20. In other words, the memory cells MC each having a structure of surrounding the periphery of the channel with the control gate are formed at the respective intersections between the channel body 20 and the electrode layers WL.

The memory film 30 has, for example, a block insulating film 35, the charge storage film 32, and a tunnel insulating film 31. The block insulating film 35 has contact with the electrode layers WL, the tunnel insulating film 31 has contact with the channel body 20, and the charge storage film 32 is provided between the block insulating film 35 and the tunnel insulating film 31.

The block insulating film 35 prevents the charge stored in the charge storage film 32 from being diffused to the electrode layers WL.

The charge storage film 32 has a number of trap sites for capturing the charge, and includes, for example, a silicon nitride film.

The tunnel insulating film 31 acts as a potential barrier when the charge is injected from the channel body 20 to the charge storage film 32, or when the charge stored in the charge storage film 32 is diffused in the channel body 20. The tunnel insulating film 31 is, for example, a silicon oxide film.

Alternatively, it is also possible to use a stacked film (ONO film) having a structure of sandwiching a silicon nitride film with a pair of silicon oxide films as the tunnel insulating film 31. By using the ONO film as the tunnel insulating film 31, the erasure operation can be performed in a lower electric field compared to the case of a single layer of the silicon oxide film.

It should be noted that as shown in, for example, FIG. 5B, it is also possible for each of the electrode layers WL to include an insulating film 40i having contact with the insulating portion 40 and the block insulating film 35. The insulating portion 40 can also include the same material as, for example, the plurality of second layers 60b and the plurality of fourth layers 45b.

An example of a method of manufacturing the semiconductor memory device according to the embodiment will be explained with reference to FIGS. 6 through 12.

As shown in FIG. 6, on the substrate 10 of the peripheral circuit 2 and the intermediate portions 4, there is formed the insulating film 80. Subsequently, trenches piercing the insulating film 80 to reach the substrate 10 are formed, and in the trenches, there are formed the insulating portions 41, 51 (the first insulating portion, a second insulating portion), respectively. The insulating portions 41, 51 each include, for example, a silicon oxide film.

In the Y-direction, the width W1 of the insulating portion 41 is larger than the width W2 of the upper surface of the insulating portion 51. The upper surface of the insulating portion 41 is formed to be located lower than, for example, the upper surface of the insulating portion 51. The upper surface of the insulating portion 41 recedes due to, for example, a process of insulating portions 41, 51, and a process performed when forming the gate electrode 52.

On the substrate 10 of the peripheral circuit 2, there is formed the gate electrode 52 via the insulating film 80. On the insulating portion 41 of the intermediate portions 4, there is formed the gate electrode 42.

On the substrate 10 located between the gate electrode 52 and the insulating portion 51, there is formed the semiconductor portion 54. The upper surface of the gate electrode 52 is located higher than the upper surface of the gate electrode 42. The gate electrode 52 is sandwiched by the pair of semiconductor portions 54. For example, one of the pair of semiconductor portions 54 includes an n-type impurity, and the other of the pair of semiconductor portions 54 includes a p-type impurity.

On the insulating portions 41, 51, the gate electrodes 42, 52, and the semiconductor portion 54, there are formed the insulating layers 81, 82. On the insulating layers 81, 82, there are formed insulating films 55 through 58.

The insulating film 55 is used as a stopper film used when forming, for example, the contact portions 53 described later. The insulating film 56 is used as a stopper film used when removing, for example, the stacked body formed to the peripheral circuit 2 described later. The insulating film 57 is used as a stopper film used when removing, for example, an upper surface of a lower layer portion 15s described later. The insulating film 58 is used as a stopper film used when removing, for example, the lower layer portion 15s provided to the peripheral circuit 2 described later. The insulating films 55 through 58 each include, for example, either of a silicon oxide film and a silicon nitride film.

Then, the insulating films 55 through 58, and so on formed on the substrate 10 of the memory cell portion 1 are removed. Thus, the insulating film 80 is exposed.

The insulating film 80 of the memory cell portion 1 forms an insulating film 99 so as to have a desired thickness, and then the lower layer portion 15s of the stacked body 15 is formed on the insulating film 99. In the lower layer portion 15s, there are formed the third layers 45a and the fourth layers 45b alternately. An upper surface of the uppermost layer of the lower layer portion 15s is formed so as to be coplanar with, for example, the upper surface of the insulating film 57 of the peripheral circuit 2.

On this occasion, the lower layer portion 15s is integrally formed on the insulating film 58 of the peripheral circuit 2, the intermediate portions 4, and the scribe line 3. Further, a plurality of sets of the memory cell portion 1, the peripheral circuit 2, and the intermediate portions 4 described above is formed so as to be bounded by the scribe lines 3 shown in FIG. 1A.

Figure 7:
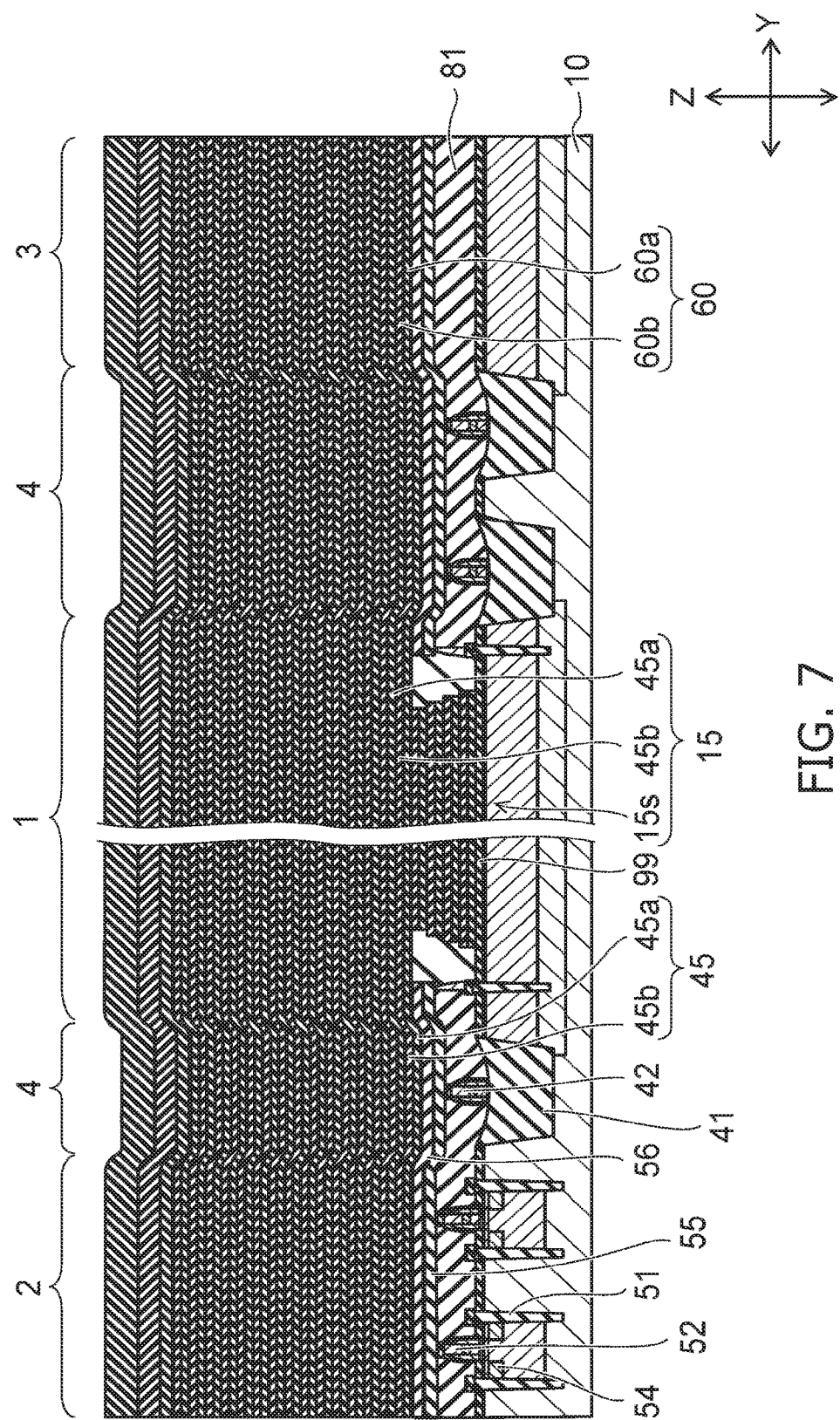

As shown in FIG. 7, the lower layer portion 15s formed on the insulating film 55 of the peripheral circuit 2, the scribe line 3, and the intermediate portions 4 is removed. In this case, the insulating film 58, for example, is used as a stopper film when removing the lower layer portion 15s.

A stairs shape is formed on the side surface of the lower layer portion 15s of the memory cell portion 1, and an insulating film is formed in the periphery of the stairs shape. On this occasion, the insulating film 57, for example, is used as a stopper film when planarizing the upper surface of the stairs shape and the insulating film, and the insulating film 58 is removed in the planarizing process. Then, after the planarizing process, the insulating film 57 is removed.

Subsequently, the stacked bodies 45, 60 are integrally formed on the insulating film 56. In each of the stacked bodies 45, 60, the third layers 45a (the first layers 60a) and the fourth layers 45b (the second layers 60b) are alternately formed. On the lower layer portion 15s, there are formed the third layers 45a and the fourth layers 45b alternately to form the stacked body 15. The uppermost layer of the stacked body 45 is located lower than the uppermost layers of the respective stacked bodies 15, 60.

Figure 8:
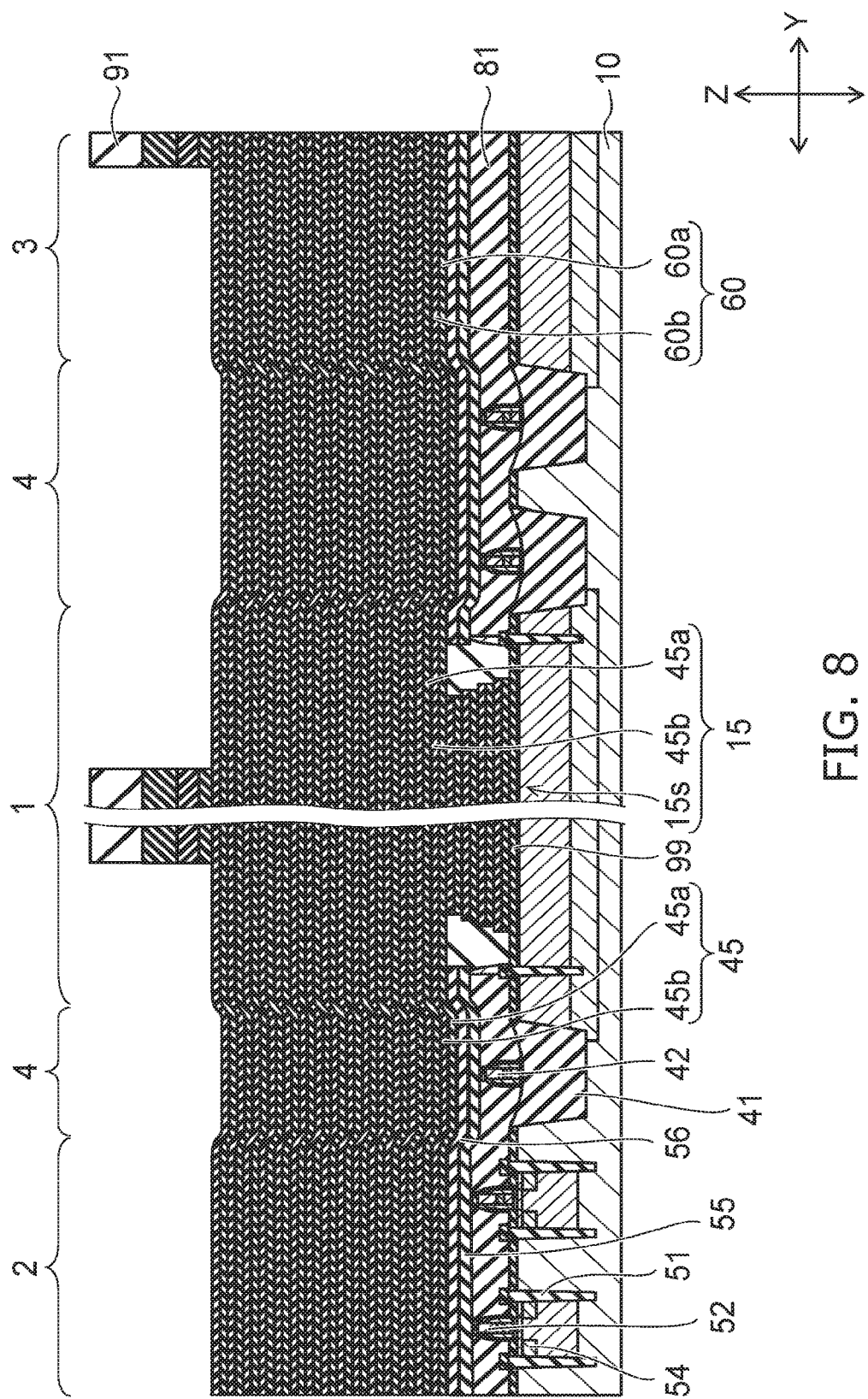

As shown in FIG. 8, on each of the stacked bodies 15, 60, there is formed a resist 91. The resist 91 is formed integrally on the stacked bodies 15, 45, and 60. Subsequently, some parts of the resist 91 are removed using, for example, a photo engraving process (PEP) to thereby keep the resist 91 on a part of each of the stacked bodies 15, 60.

Subsequently, an upper layer of each of the stacked bodies 15, 45, and 60 is partially removed. The layers 45a, 45b, 60a, and 60b of the stacked bodies 15, 45, and 60 are removed using, for example, a reactive ion etching (RIE) method.

On this occasion, the stacked bodies 15, 60 located in parts formed with the resist 91 remain unremoved. Therefore, the number of stacked layers in each of the stacked bodies 15, 60 in the parts formed with the resist 91 is larger than the number of stacked layers in each of the stacked bodies 15, 45, and 60 not formed with the resist 91.

Figure 9:
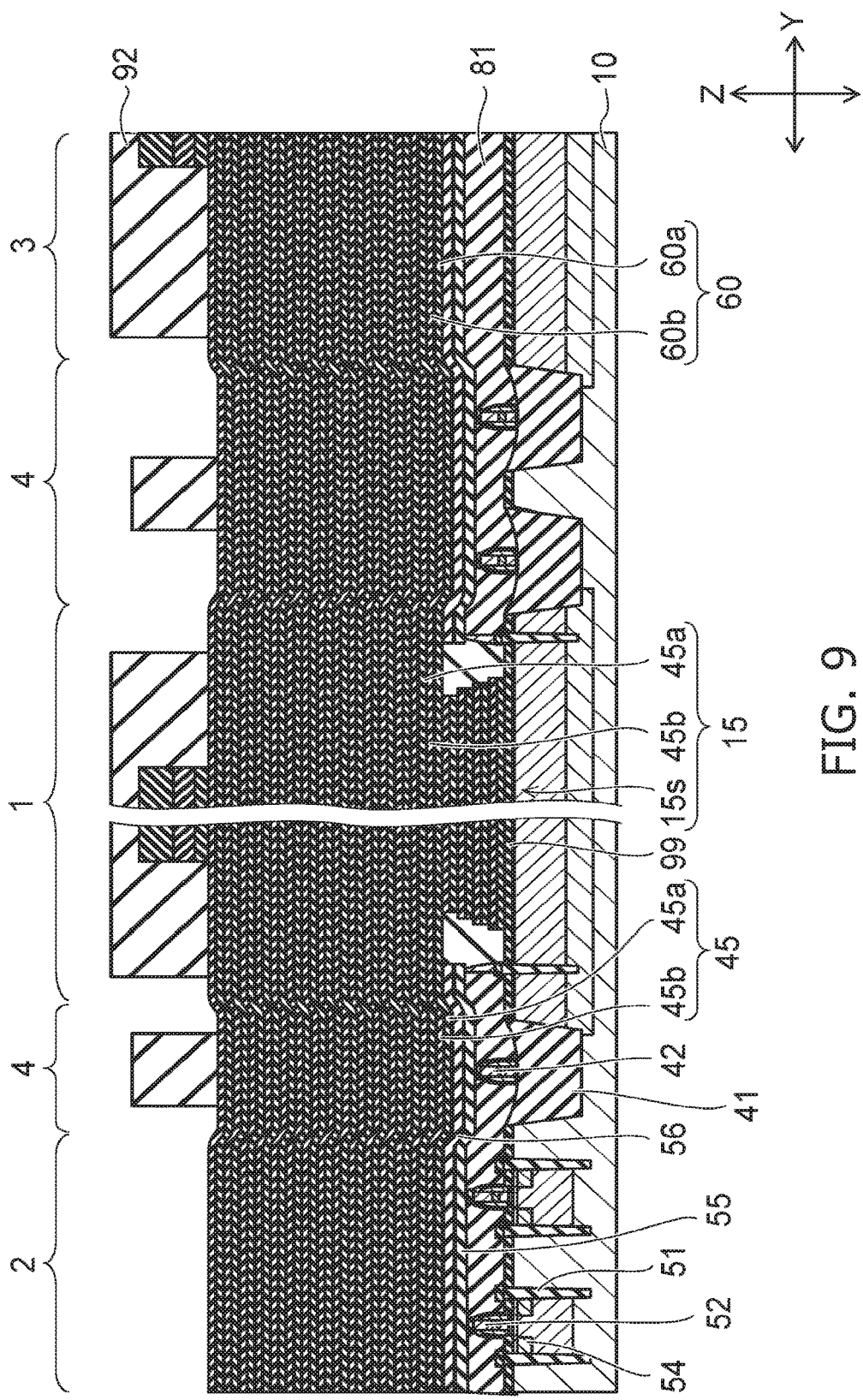

As shown in FIG. 9, after removing the resist 91, on each of the stacked bodies 15, 45, and 60, there is formed a resist 92. The resist 92 is formed integrally on the stacked bodies 15, 45, and 60. Subsequently, some parts of the resist 92 are removed using, for example, the PEP to thereby keep the resist 92 on a part of each of the stacked bodies 15, 45, and 60. On this occasion, the resist 92 covers a part of each of the stacked bodies 15, 60 where the number of stacked layers is large.

Figure 10:
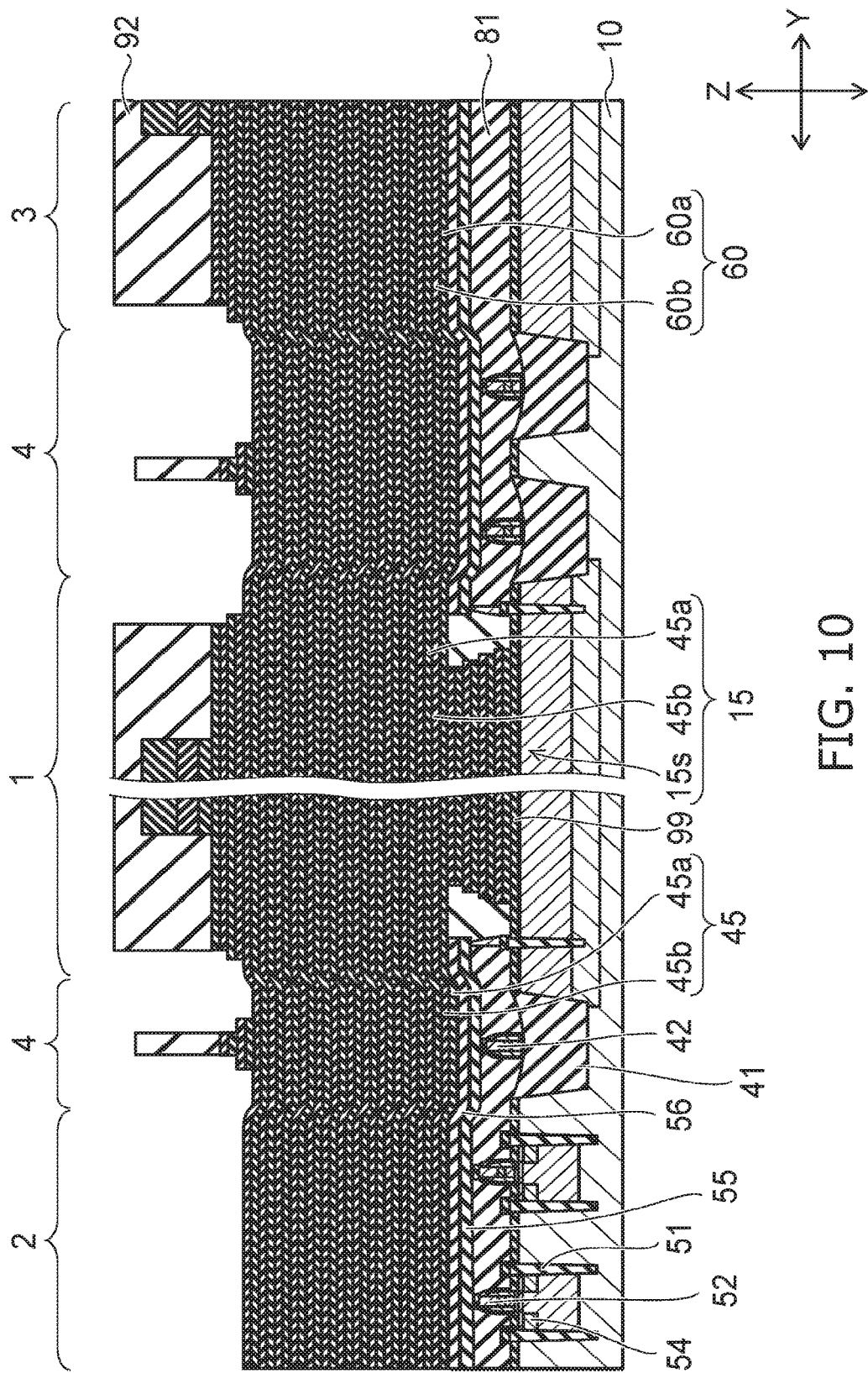

As shown in FIG. 10, the upper layer of each of the stacked bodies 15, 45, and 60 is partially removed. Each of the stacked bodies 15, 45 is removed as much as one of the layers 45a and one of the layers 45b, and the stacked body 60 is removed as much as one of the layers 60a and one of the layers 60b using, for example, the RIE method. On this occasion, the stacked bodies 15, 45, and 60 located in parts formed with the resist 92 remain unremoved.

Subsequently, the side surfaces of, for example, the resist 92 are removed (slimming). Thus, the upper surface of each of the stacked bodies 15, 45, and 60, which has been covered with the resist 92, is exposed. Then, the upper layer of each of the stacked bodies 15, 45, and 60 including the upper surface thus exposed is partially removed. Each of the stacked bodies 15, 45 is removed as much as one of the layers 45a and one of the layers 45b, and the stacked body 60 is removed as much as one of the layers 60a and one of the layers 60b using, for example, the RIE method.

The removal of the side surfaces of the resist 92 and the removal of each of the stacked bodies 15, 45, and 60 described above are executed a plurality of times. Thus, the end portions of each of the stacked bodies 15, 45, and 60 each form the stairs shape. It should be noted that the number of times of execution described above is arbitrary. The number of stacked layers in the stacked body 45 shown in FIG. 2 depends on the number of times of execution of the process described above.

Figure 11:
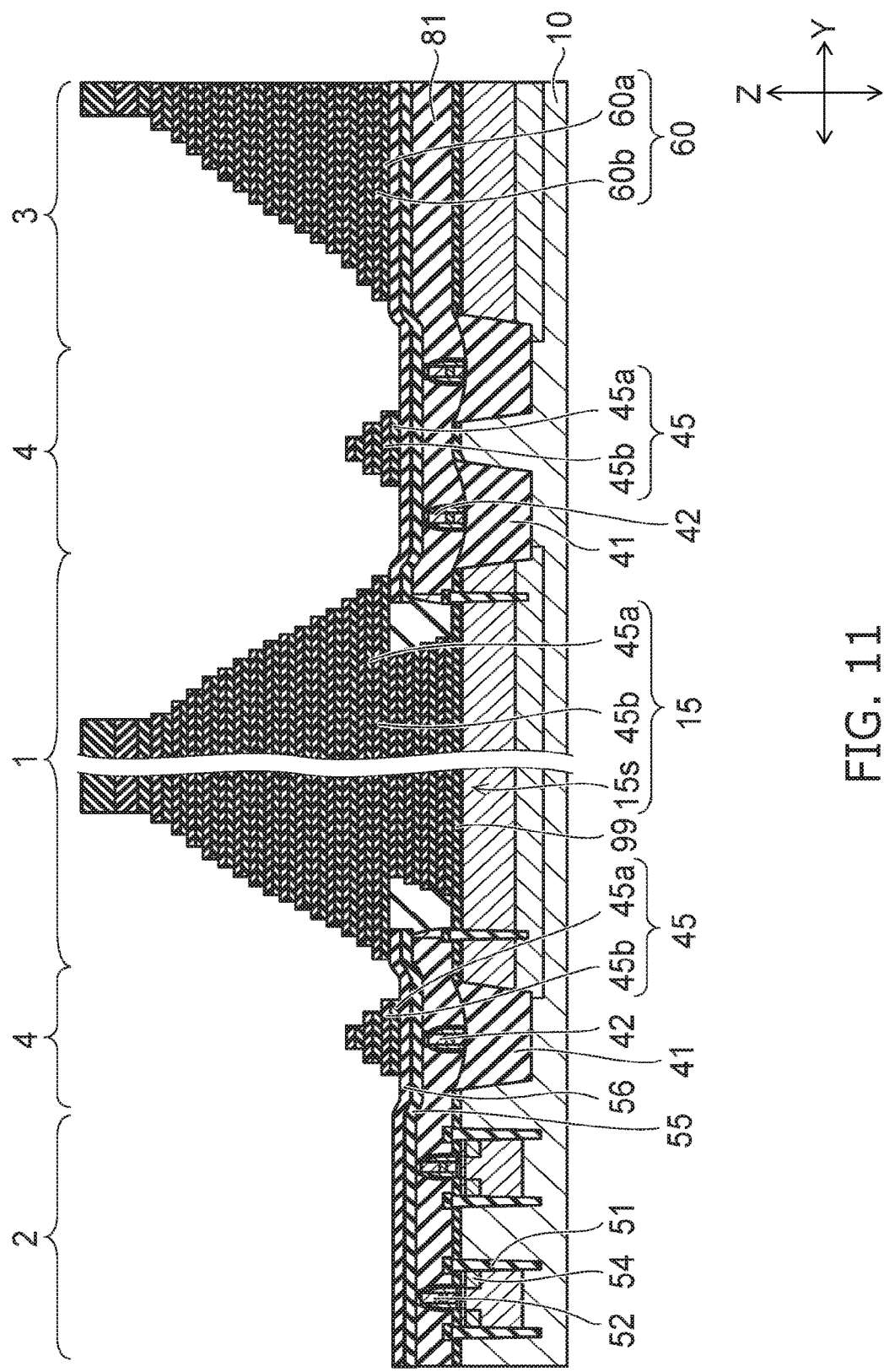

As shown in FIG. 11, the resist 92 formed on each of the stacked bodies 15, 45, and 60 is removed. Subsequently, a resist is integrally formed on the stacked bodies 15, 45, and 60. Some parts of the resist are removed using, for example, the PEP to thereby keep the resist on a part of each of the stacked bodies 15, 60. The resist on the stacked body 45 is completely removed.

Subsequently, an upper layer of each of the stacked bodies 15, 45, and 60 is partially removed using, for example, the RIE method. Subsequently, side surfaces of the resist are removed.

By repeating the process described above a plurality of times, the insulating film 56 is exposed in the peripheral circuit 2. The number of stacked layers in the stacked body 45 is smaller than the number of stacked layers in each of the stacked bodies 15, 60. The stacked bodies 15, 45, and 60 are separated from each other.

Figure 12:
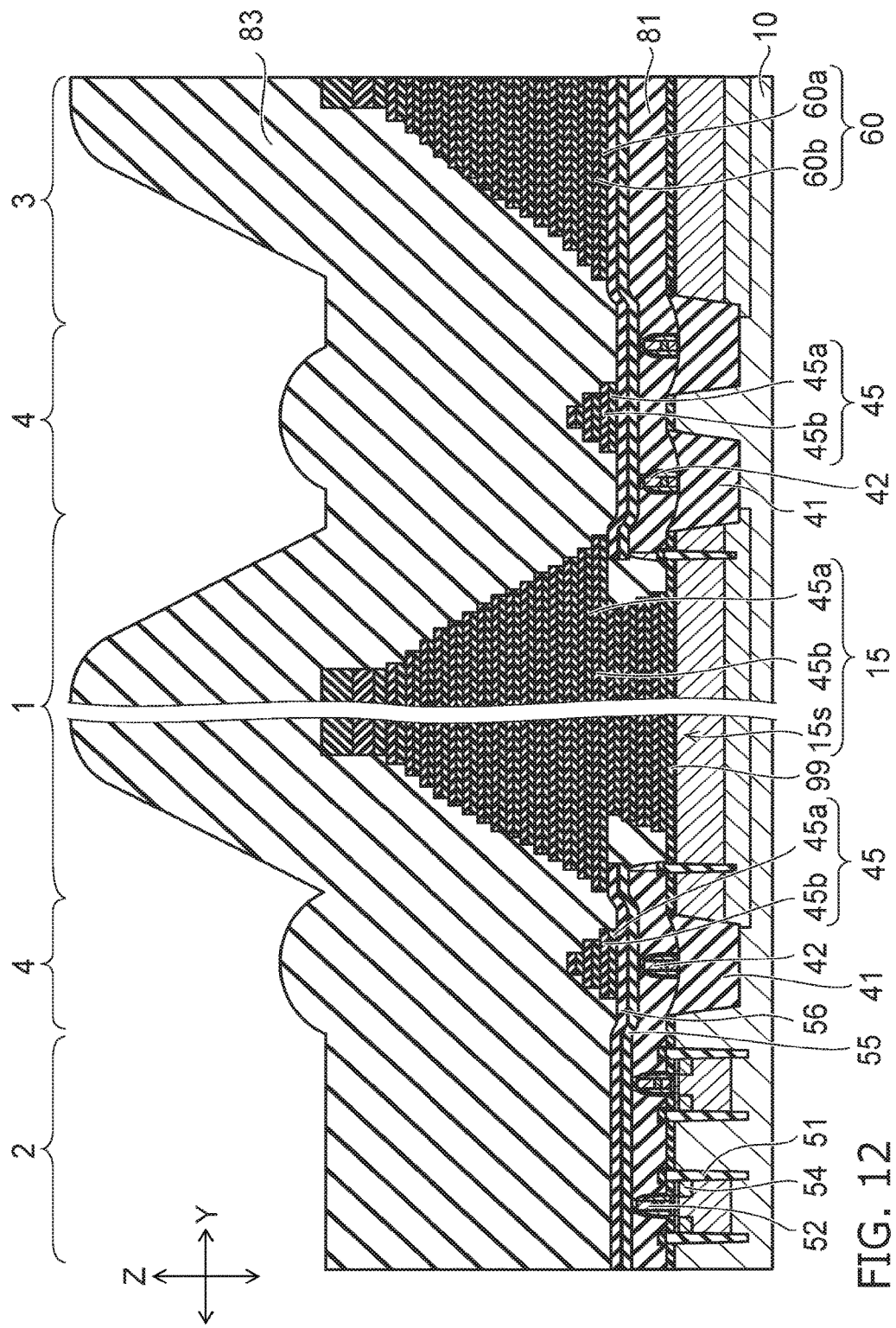

As shown in FIG. 12, on the insulating film 56 and the stacked bodies 15, 45, and 60, there is formed the insulating layer 83. The insulating layer 83 is integrally formed in the memory cell portion 1, the peripheral circuit 2, the scribe line 3, and the intermediate portions 4. As the insulating layer 83, there is included, for example, a silicon oxide film.

The upper surface of the insulating layer 83 formed in the intermediate portions 4 is located higher than the upper surface of the insulating layer 83 formed in the peripheral circuit 2, and is located lower than the upper surface of the insulating layer 83 formed in the memory cell portion 1 and the scribe line 3.

Subsequently, as shown in FIG. 2, the upper surface of the insulating layer 83 is planarized using, for example, a chemical mechanical polish (CMP) method and an etching method. It should be noted that the uppermost layer films of the stacked bodies 15, 60 are removed when performing an etching process.

Then, an interlayer film is deposited to form the columnar portion CL shown in FIG. 4. Subsequently, the third layers 45a of the stacked body 15 are removed, and the electrode layers WL are formed (a replacing process).

On this occasion, the electrode layers WL each include, for example, metal, and each include a material different from that of the third layers 45a. Subsequently, the contacts are provided to the peripheral circuit 2 as shown in FIG. 2, and the bit lines BL and so on shown in FIG. 4 are formed to form the semiconductor memory device according to the embodiment. It should be noted that by performing singulation along the scribe line 3 as a boundary after forming the configuration described above, the semiconductor memory device having the configuration shown in FIG. 1A is formed. Thus, a plurality of semiconductor memory devices can be formed at a time.

The effects of the embodiment will be described.

According to the embodiment, the stacked body 45 is provided on the gate electrode 42. The gate electrode 42 is provided on the insulating portion 41. The upper surface of the gate electrode 42 formed on the insulating portion 41 is located lower than the upper surface of the gate electrode 52 formed on the substrate 10. Specifically, by forming the stacked body 45 on the gate electrode 42, the upper surface of the insulating layer 83 formed on the intermediate portions 4 can be formed at a higher position. Therefore, in the working process of the upper surface of the insulating layer 83, it is possible to planarize the insulating layer 83 formed on the memory cell portion 1, the peripheral circuit 2, the scribe line 3 and the intermediate portions 4 at a time. Thus, the flatness of the upper surface of the insulating layer 83 provided on the stacked body 45 is improved.

For example, in some cases, the stacked body 45 fails to be provided on the gate electrode 42. In such a case, the upper surface of the insulating layer 83 provided on the gate electrode 42 is located lower than the upper surface of the insulating layer 83 provided on the memory cell portion 1, the peripheral circuit 2, and the scribe line 3. Specifically, the upper surface of the insulating layer 83 provided on the insulating portion 41 is located lower than the upper surface of the insulating layer 83 provided on other portions than the insulating portion 41. A lower part of the upper surface of the insulating layer 83 extends, for example, in the X-Y plane in a range of several micrometers through several tens of micrometers. Therefore, there is a possibility that the flatness of the upper surface of the insulating layer 83 is deteriorated in the working process of the upper surface of the insulating layer 83. Thus, it is possible to cause a problem of pattern short or pattern open or a problem that the metal material remains in the lower part of the upper surface of the insulating layer 83 due to the defocus in a lithography process of, for example, a interconnect process.

Further, in the case of newly providing the gate electrode (gate dummy) being in contact with the intermediate portion 4 on the surface of the substrate 10, there can occur the problem that the chip area is dramatically enlarged.

In contrast, according to the embodiment, by providing the stacked body 45 on the gate electrode 42, the upper surface of the insulating layer 83 on the stacked body 45 can be formed at a higher position. Therefore, it becomes easy to improve the flatness of the upper surface of the insulating layer 83. Thus, it becomes possible to solve the problem of the pattern short and so on due to the defocus described above without enlarging the chip area.

In addition to the above, according to the embodiment, the electrode layers WL of the stacked body 15 each include the material different from that of the third layer 45a. Further, the third layers 45a each include the same material as that of the first layer 60a, and the fourth layers 45b each include the same material as that of the second layer 60b. Therefore, the stacked body 45 can be formed in the same process as that of the stacked body 60, and it is possible to improve the flatness of the upper surface of the insulating layer 83 without increasing the number of processes.

(Second Embodiment)

An example of a configuration of a semiconductor memory device according to the embodiment will be explained with reference to FIG. 13.

Figure 13:
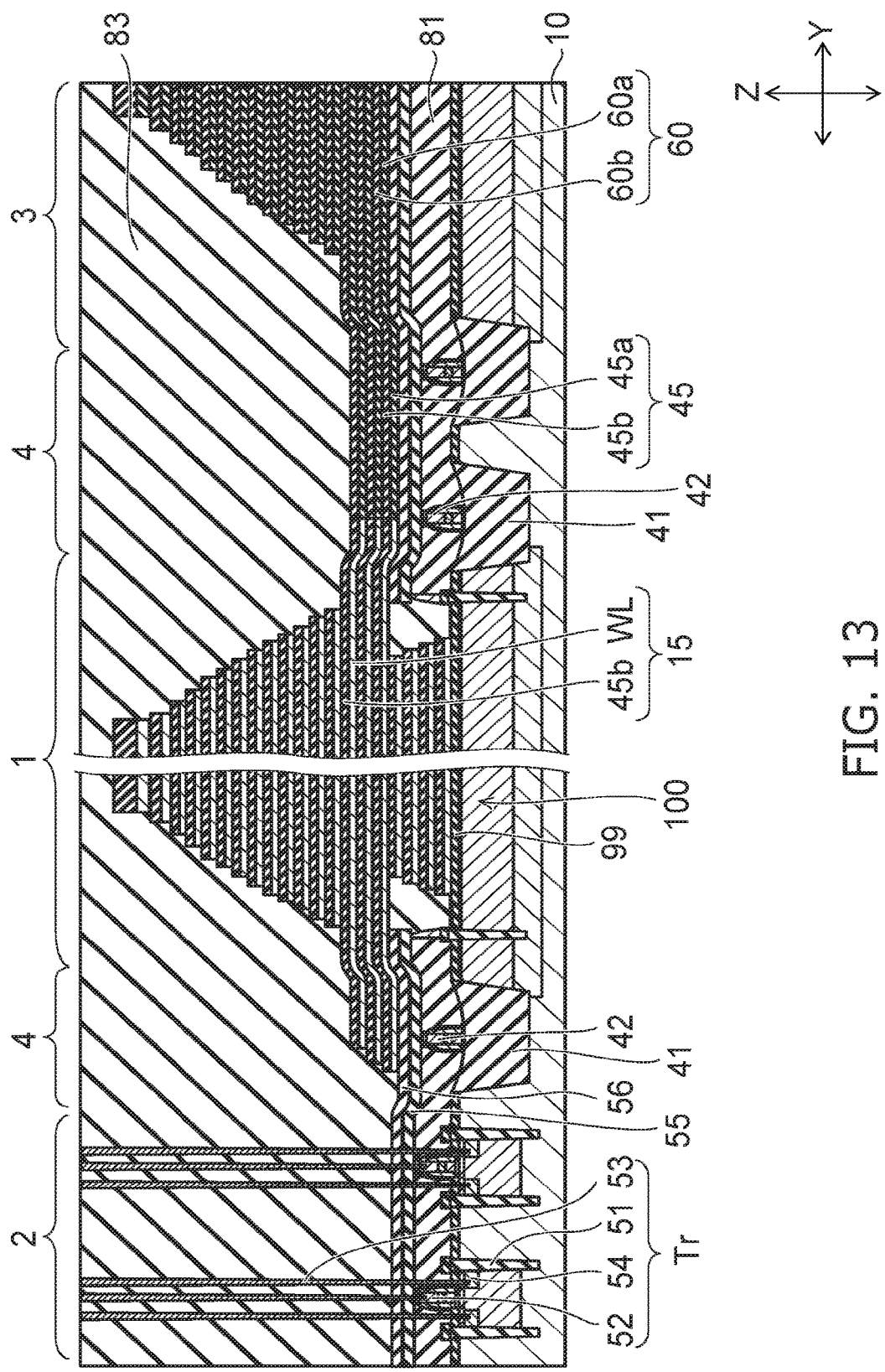
FIG. 13 is a schematic cross-sectional view of the semiconductor memory device of a second embodiment.

FIG. 13 is a schematic cross-sectional view of the semiconductor memory device according to the embodiment.

In the embodiment, a major difference from the embodiment described above is a configuration of the stacked body 45. Therefore, regarding the part substantially the same as that of the embodiment described above, the description will be omitted.

As shown in FIG. 13, the stacked body 45 is provided integrally with a part of each of the stacked bodies 15, 60. The stacked body 45 is provided integrally with the stacked body 15 in the part not connected to the contact portion, for example.

The stacked body 45 provided between the stacked bodies 15, 60 does not have the stairs shape. In each of the stacked bodies 15, 60, the layers located higher than the layers provided integrally with the stacked body 45 have the stairs shape.

The upper surface of the uppermost layer of the stacked body 45 is located lower than the upper surface of each of the uppermost layers of the respective stacked bodies 15, 60.

In the layers of the stacked body 15 connected to the layers of the stacked body 45, the electrode layers WL have contact with the third layers 45a. Further, the fourth layers 45b are respectively provided between the electrode layers WL, and are provided integrally from the stacked body 45 to the stacked body 15. In the part of the stacked body 45 formed with the memory cell MC not shown, there are provided the electrode layers WL and the insulating portions 40. For example, in the stacked body 45, it is possible to provide the electrode layers WL instead of the third layers 45a.

An example of a method of manufacturing the semiconductor memory device according to the embodiment will be explained with reference to FIGS. 14 through 19.

Similarly to the manufacturing method according to the embodiment described above, the substrate 10 of the peripheral circuit 2 and the intermediate portions 4 is formed with the trenches, and the insulating portions 41, 51 are respectively formed in the trenches as shown in FIG. 6 through FIG. 8.

On the substrate 10 of the peripheral circuit 2, there is formed the gate electrode 52 via the insulating film 80. On the insulating portion 41 of the intermediate portions 4, there is formed the gate electrode 42.

On the substrate 10 located between the gate electrode 52 and the insulating portion 51, there is formed the semiconductor portion 54. The gate electrode 52 is sandwiched by the pair of semiconductor portions 54.

On the insulating portions 41, 51, the gate electrodes 42, 52, and the semiconductor portion 54, there are formed the insulating layers 81, 82. On the insulating layers 81, 82, there are formed the insulating films 55 through 58.

Then, the insulating films 55 through 58, and so on formed on the substrate 10 of the memory cell portion 1 are removed. Thus, the insulating film 80 is exposed.

The insulating film 80 of the memory cell portion 1 forms the insulating film 99 so as to have a desired thickness, and then the lower layer portion 15s of the stacked body 15 is formed on the insulating film 99. On this occasion, the lower layer portion 15s is integrally formed on the insulating film 58 of the peripheral circuit 2, the intermediate portions 4, and the scribe line 3.

Then, the lower layer portion 15s formed on the insulating film 58 of the peripheral circuit 2, the scribe line 3, and the intermediate portions 4 is removed. Then, the stairs shape is formed on each of the side surfaces of the lower layer portion 15s of the memory cell portion 1. Subsequently, similarly to the first embodiment, the stacked bodies 45, 60 are integrally formed on the insulating film 55. On the lower layer portion 15s, there is formed the stacked body 15.

Then, the resist 91 is integrally formed on the stacked bodies 15, 45, and 60. Subsequently, some parts of the resist 91 are removed using, for example, the PEP to thereby keep the resist 91 on a part of the stacked body 60.

Then, an upper layer of each of the stacked bodies 15, 45, and 60 is partially removed. Each of the stacked bodies 15, 45 is removed as much as one of the layers 45a and one of the layers 45b, and the stacked body 60 is removed as much as one of the layers 60a and one of the layers 60b using, for example, the RIE method.

On this occasion, the stacked bodies 15, 60 located in parts formed with the resist 91 remain unremoved. Therefore, the number of stacked layers in each of the stacked bodies 15, 60 in the parts formed with the resist 91 is larger than the number of stacked layers in each of the stacked bodies 15, 45, and 60 not formed with the resist 91. The upper surface of the stacked body 45 is located lower than the upper surfaces of the respective stacked bodies 15, 60 in the parts not formed with the resist 91.

Figure 14:
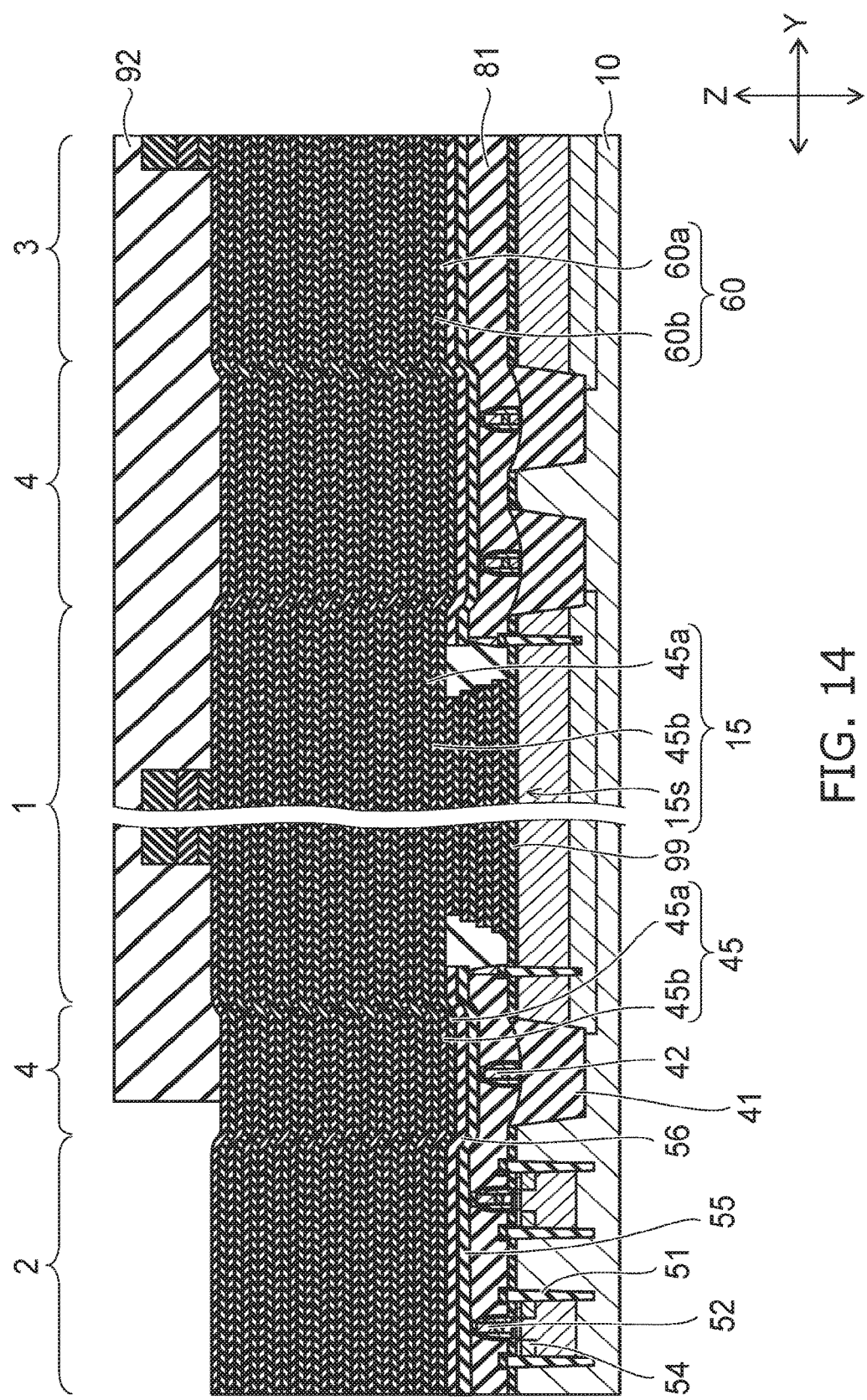
FIG. 14 to FIG. 19 are schematic cross-sectional views showing a method for manufacturing the semiconductor memory device of the second embodiment.

As shown in FIG. 14, after removing the resist 91, on each of the stacked bodies 15, 60 and the stacked body 45 located between the stacked bodies 15, 60, there is formed the resist 92. The resist 92 is integrally formed on the stacked bodies 15, 45, and 60, and is then partially removed using, for example, the PEP to keep the resist 92 on the stacked bodies 15, 60. On this occasion, the resist 92 covers a part of each of the stacked bodies 15, 60 and the stacked body 45 located between the stacked bodies 15, 60 where the number of stacked layers is large.

Figure 15:
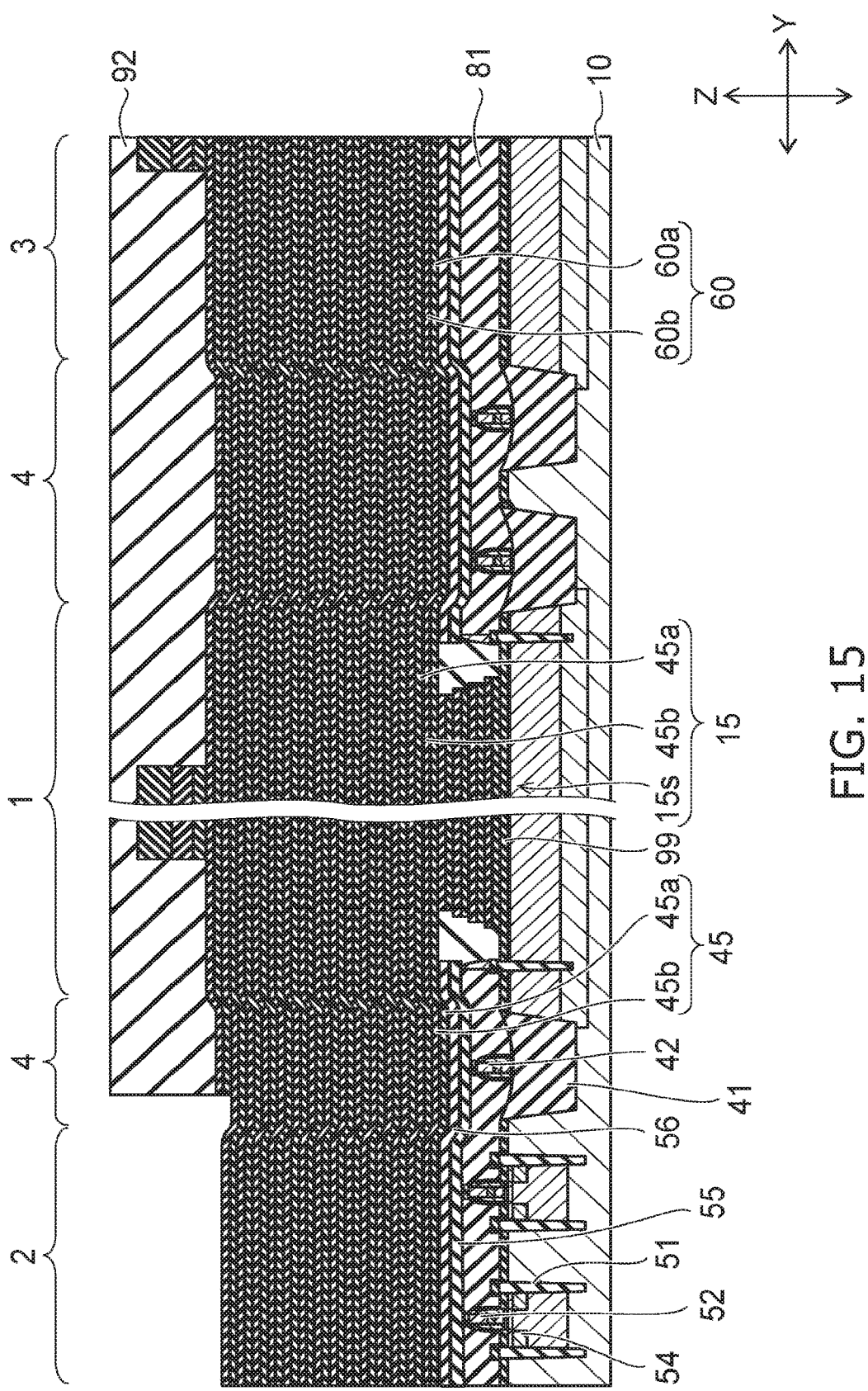

As shown in FIG. 15, the upper layer of the stacked body 45 is partially removed. The stacked body 45 is removed as much as one of the layers 45a and one of the layers 45b using, for example, the RIE method.

Figure 16:
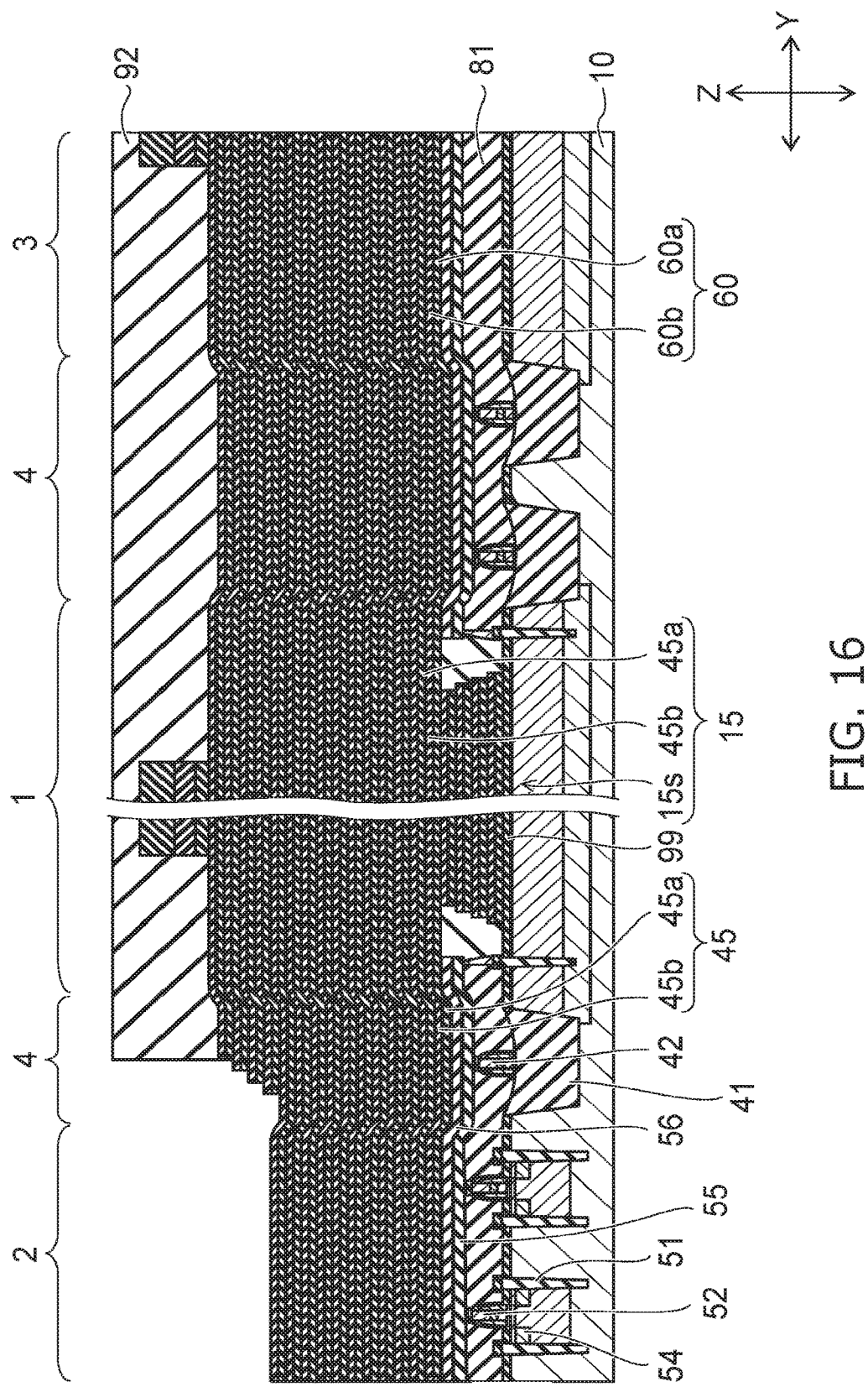

Subsequently, as shown in FIG. 16, the side surfaces of, for example, the resist 92 are removed. Thus, the upper surface of the stacked body 45, which has been covered with the resist 92, is exposed. Then, the upper layer of the stacked body 45 including the upper surface thus exposed is partially removed. The stacked body 45 is removed as much as one of the layers 45a and one of the layers 45b using, for example, the RIE method.

The removal of the side surfaces of the resist 92 and the removal of the stacked body 45 described above are performed a plurality of times. Thus, the end portion of the stacked body 45 forms the stairs shape. On this occasion, the part covered with the resist 92 is not formed with the stairs shape. Subsequently, the resist 92 is removed.

Figure 17:
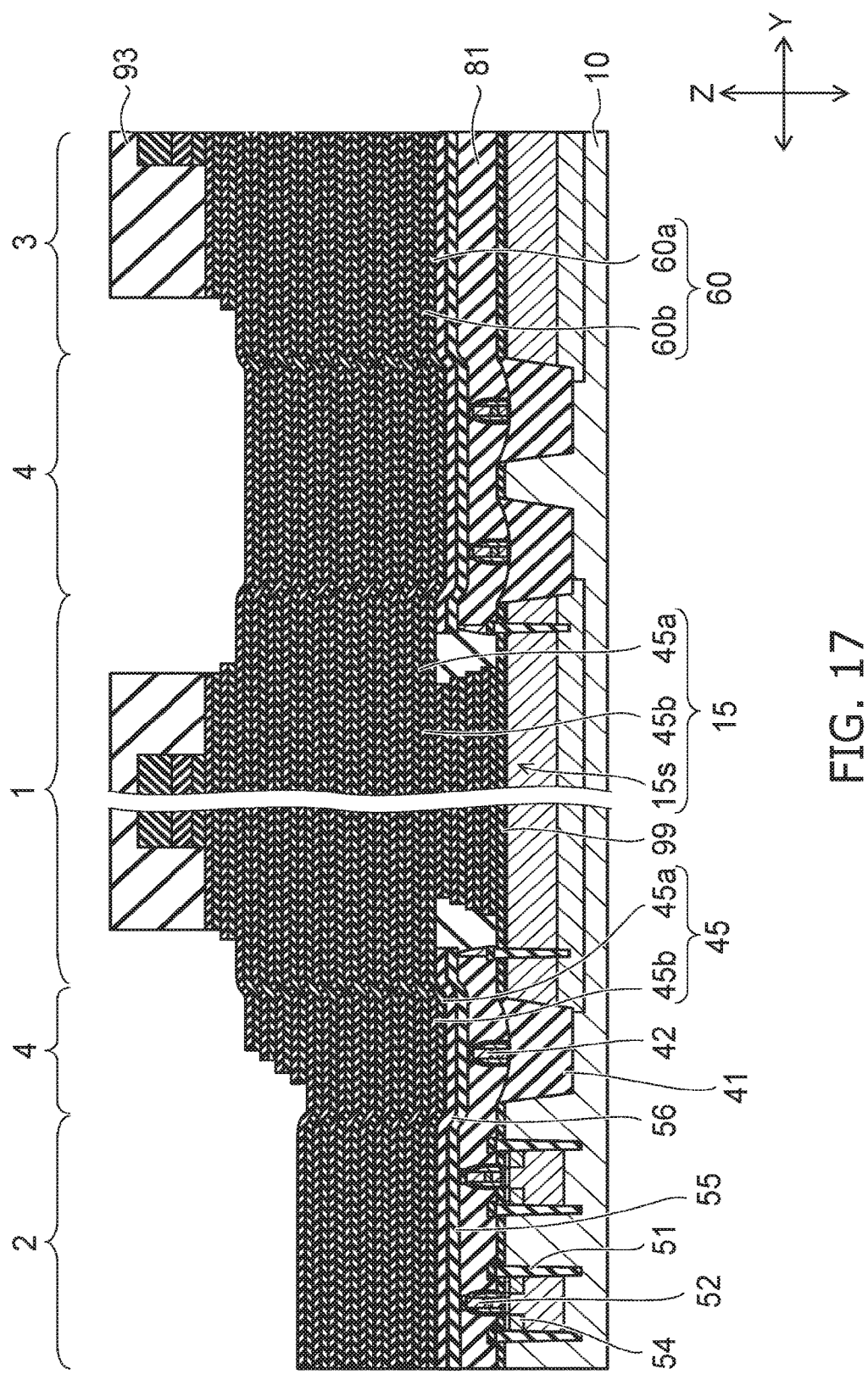

As shown n FIG. 17, on each of the stacked bodies 15, 60, there is formed a resist 93. The resist 93 is integrally formed on the stacked bodies 15, 45, and 60, and is then partially removed using, for example, the PEP to keep the resist 93 on a part of each of the stacked bodies 15, 60. On this occasion, the resist 93 covers a part of each of the stacked bodies 15, 60 and the stacked body 45 located between the stacked bodies 15, 60 where the number of stacked layers is large.

Then, an upper layer of each of the stacked bodies 15, 45, and 60 is partially removed. Each of the stacked bodies 15, 45 is removed as much as one of the layers 45a and one of the layers 45b, and the stacked body 60 is removed as much as one of the layers 60a and one of the layers 60b using, for example, the RIE method.

Subsequently, the side surfaces of, for example, the resist 93 are removed. Thus, the upper surface of each of the stacked bodies 15, 45, and 60, which has been covered with the resist 93, is exposed. Then, the upper layer of each of the stacked bodies 15, 45, and 60 including the upper surface thus exposed is partially removed. Each of the stacked bodies 15, 45 is removed as much as one of the layers 45a and one of the layers 45b, and the stacked body 60 is removed as much as one of the layers 60a and one of the layers 60b using, for example, the RIE method.

The removal of the side surfaces of the resist 93 and the removal of each of the stacked bodies 15, 45, and 60 described above are performed a plurality of times. Thus, the end portions of each of the stacked bodies 15, 60 each form the stairs shape. On this occasion, since the stacked body 45 keeps the state of being formed integrally with the stacked bodies 15, 60, the stacked body 45 is not formed with the stairs shape. Subsequently, the resist 93 is removed.

Figure 18:
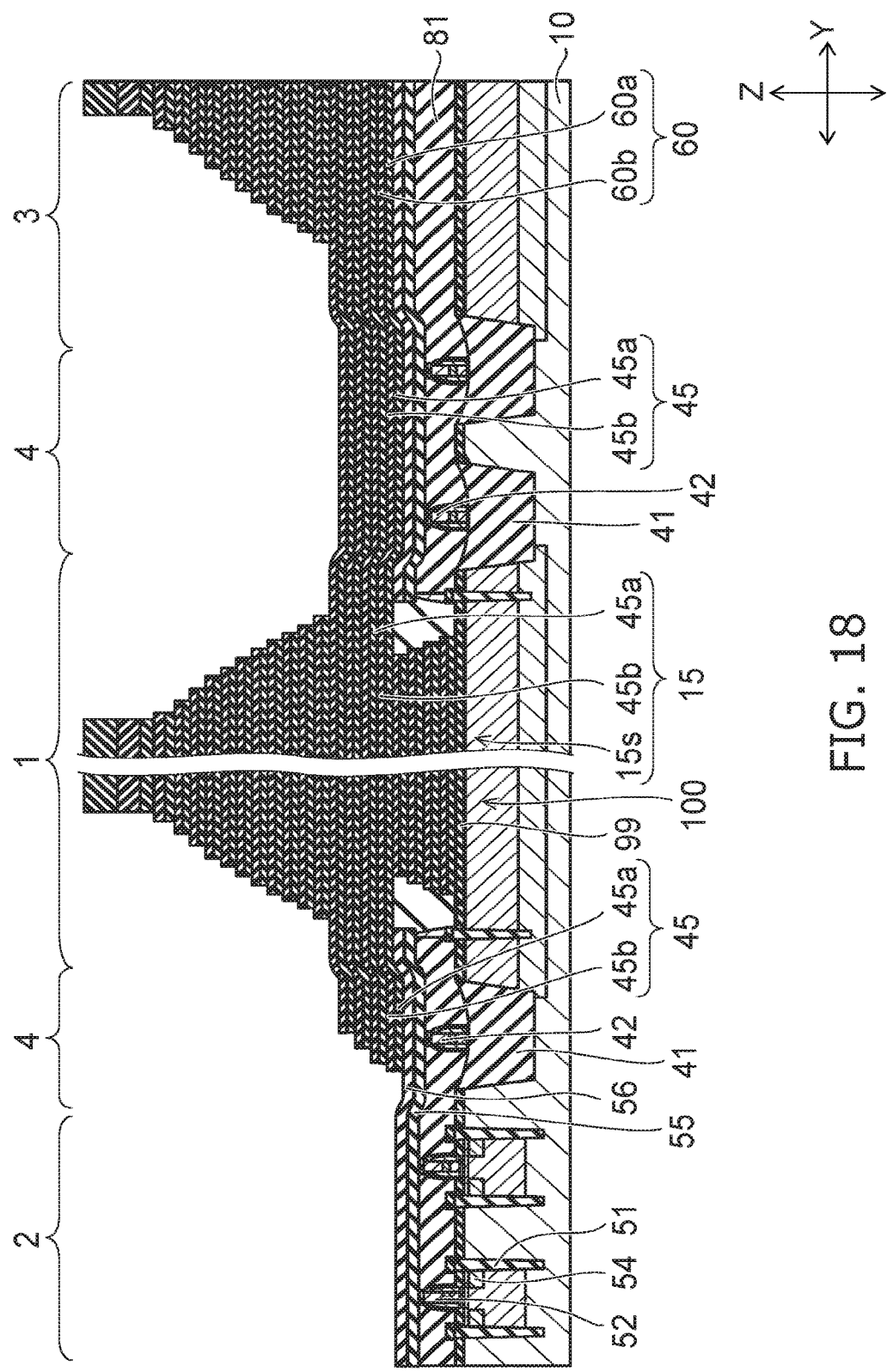

As shown in FIG. 18, by repeating the process described above a plurality of times, the insulating film 56 is exposed in the peripheral circuit 2.

The stacked body 45 formed between the memory cell portion 1 and the peripheral circuit 2 has, for example, a stairs shape. The stacked body 45 formed between the memory cell portion 1 and the scribe line 3 is formed integrally with the stacked bodies 15, 60. The number of stacked layers in the stacked body 45 is smaller than the number of stacked layers in each of the stacked bodies 15, 60.

Figure 19:
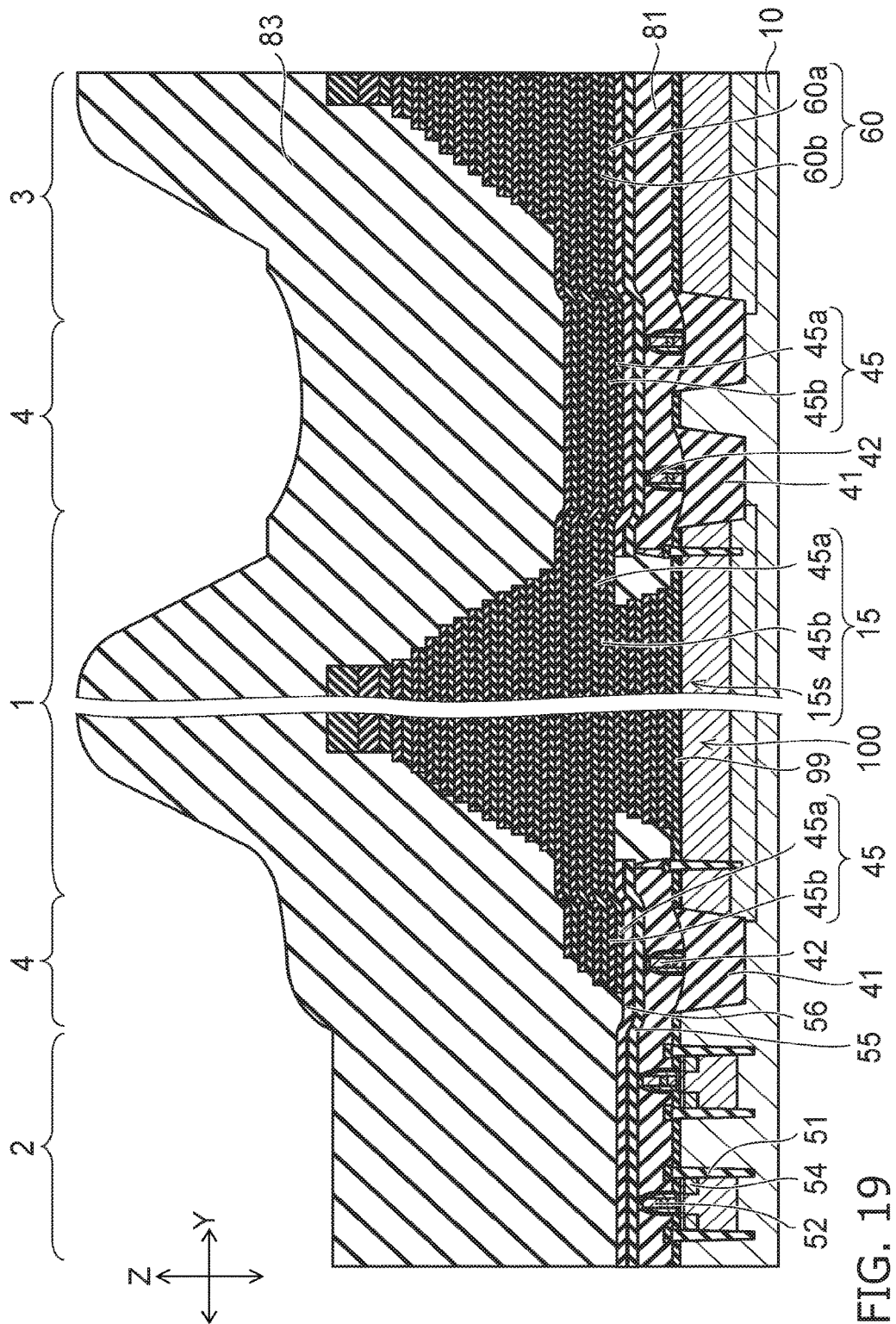

As shown in FIG. 19, on the insulating film 56 and the stacked bodies 15, 45, and 60, there is formed the insulating layer 83. The insulating layer 83 is integrally formed in the memory cell portion 1, the peripheral circuit 2, the scribe line 3, and the intermediate portions 4.

The upper surface of the insulating layer 83 formed in the intermediate portions 4 is located higher than the upper surface of the insulating layer 83 formed in the peripheral circuit 2, and is located lower than the upper surface of the insulating layer 83 formed in the memory cell portion 1 and the scribe line 3.

Subsequently, as shown in FIG. 13, the upper surface of the insulating layer 83 is planarized using, for example, the CMP method and an etching process. It should be noted that the uppermost layer films of the stacked bodies 15, 60 are removed when performing the etching process. Subsequently, the interlayer film is deposited to form the columnar portion CL shown in FIG. 4.

Subsequently, the third layers 45a of the stacked body 15 are partially removed, and the electrode layers WL are formed.

On this occasion, the electrode layers WL each include, for example, metal, and each include a material different from that of the third layers 45a. In other words, the stacked body 15 includes the material different from that of the stacked body 45.

Subsequently, the contacts are formed, and the bit lines BL and so on shown in FIG. 4 are formed to form the semiconductor memory device according to the embodiment.

Advantages of the embodiment will be described.

According to the embodiment, similarly to the embodiment described above, the stacked body 45 in the intermediate portion 4 is provided on the gate electrode 42. The gate electrode 42 is provided on the insulating portion 41. The upper surface of the gate electrode 42 formed on the insulating portion 41 is located lower than the upper surface of the gate electrode 52 formed on the substrate 10. The height of the stacked body 45 is lower than the height of each of the stacked bodies 15, 60. Therefore, in the working process of the upper surface of the insulating layer 83, it is possible to planarize the insulating layer 83 formed on the memory cell portion 1, the peripheral circuit 2, the scribe line 3 and the intermediate portions 4 at a time. Thus, the flatness of the upper surface of the insulating layer 83 provided on the stacked body 45 is improved.

Further, according to the embodiment, the stacked body 45 is integrally provided with the stacked bodies 15, 60. Thus, the process of forming the stacked body 45 can be made easy. Further, the variation in height of the upper surface of the insulating layer 83 can be suppressed, and thus, the flatness of the upper surface of the insulating layer 83 is further improved.

(Third Embodiment)

Figure 20:
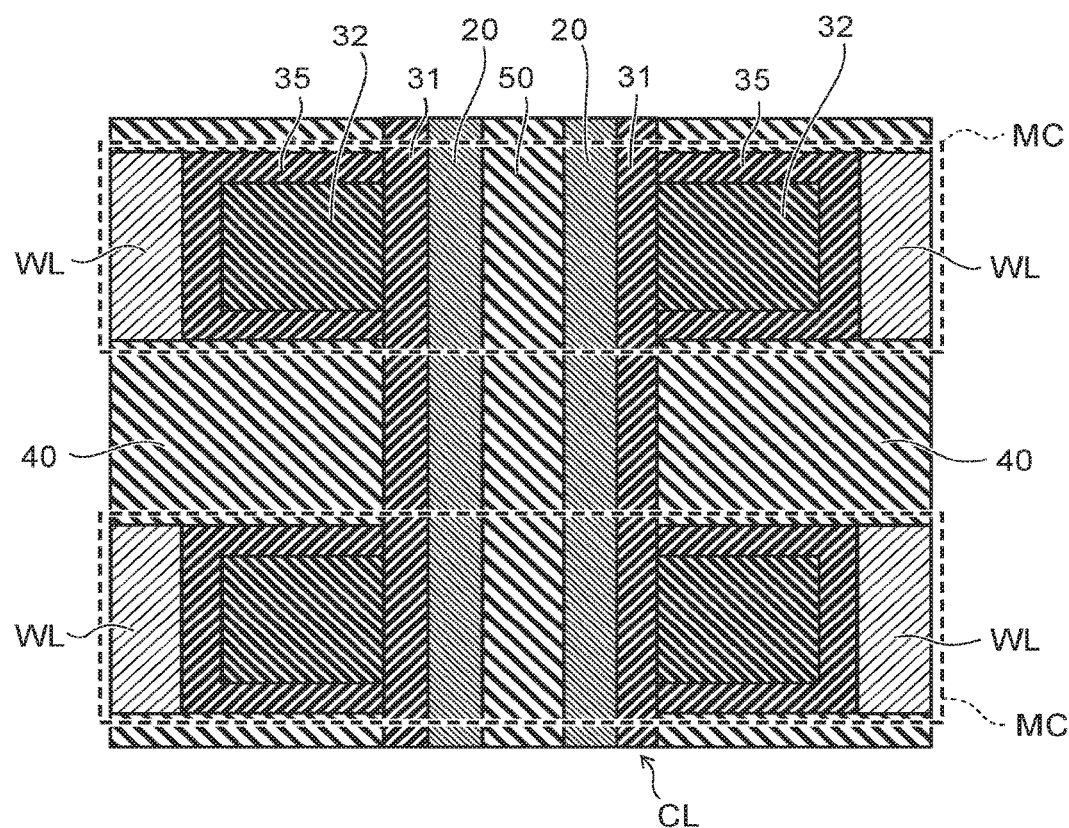
FIG. 20 is an enlarged schematic cross-sectional view of a part of a columnar portion of a third embodiment.

FIG. 20 is an enlarged schematic cross-sectional view of the part of the columnar portion CL of the embodiment.

As shown in FIG. 20, the charge storage films 32 may be provided at the memory cells (thus, on the electrode layers WL), respectively. The charge storage films 32 is stacked with the insulating portion 40, respectively. The charge storage films 32 may be include, for example, a semiconductor material being silicon and so on.

Similarly to the charge storage films 32, the block insulating films 35 may be provided respectively. The block insulating films 35 is provided between the electrode layers WL and the charge storage films 32, and between the insulating portion 40 and the charge storage films 32, respectively.

According to the embodiment, similarly to the embodiment described above, the flatness of the upper surface of the insulating layer 83 provided on the stacked body 45 is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
    a substrate;
    a first stacked body provided on the substrate, the first stacked body including
        a plurality of first layers separately stacked on each other, and
        a plurality of second layers provided between the first layers;
    a second stacked body provided on the substrate, and being larger in number of stacked layers than the first stacked body, the second stacked body including a plurality of electrode layers separately stacked on each other; and
    a third stacked body provided between the first stacked body and the second stacked body, and being smaller in number of stacked layers than the first stacked body, the third stacked body including
        a third layer including a same material as the material of the first layers, and
        a fourth layer including a same material as the material of the second layers, wherein
    the first stacked body, the second stacked body, and the third stacked body are arranged in a direction parallel to an upper surface of the substrate, a lowest surface of the third stacked body is located lower than a lowest surface of the first stacked body, and the lowest surface of the third stacked body is located higher than a lowest surface of the second stacked body.

2. The device according to claim 1, wherein the first stacked body is provided overlapping a scribe line, and the second stacked body is provided overlapping a memory cell array.

3. The device according to claim 1, further comprising:

a first insulating portion provided between the substrate and the third stacked body; and a first gate electrode provided between the first insulating portion and the third stacked body.

4. The device according to claim 1, wherein the first stacked body is provided integrally with the third stacked body.

5. The device according to claim 4, wherein the third layer is in contact with the plurality of electrode layers.

6. The device according to claim 4, wherein the fourth layer is provided between electrode layers of the plurality of electrode layers, and the fourth layer is provided integrally from the third stacked body to the second stacked body.

7. The device according to claim 1, wherein the first stacked body, the second stacked body, and the third stacked body have a stairs shape.

8. The device according to claim 1, wherein a lower surface of the third stacked body is located higher than an upper surface of the substrate provided below the second stacked body.

9. The device according to claim 1, further comprising:

an insulating layer integrally provided on the first stacked body, the second stacked body, and the third stacked body, wherein an upper surface of the insulating layer located on the third stacked body is coplanar with an upper surface of the insulating layer located on the first stacked body and an upper surface of the insulating layer located on the second stacked body.

10. The device according to claim 3, further comprising:

a transistor provided on the substrate, wherein the transistor includes a second gate electrode provided on the substrate, a second insulating portion provided on the substrate, the second insulating portion adjacent to the second gate electrode, and a semiconductor portion provided on the substrate located between the second gate electrode and the second insulating portion.

11. The device according to claim 10, wherein an upper surface of the first gate electrode is located lower than an upper surface of the second gate electrode.

12. The device according to claim 10, wherein as viewed in a stacking direction of the first stacked body, the third stacked body overlaps the first gate electrode, and is separated from the transistor.

13. The device according to claim 10, wherein the third stacked body is provided between the second stacked body and the transistor.

14. The device according to claim 10, wherein a lower surface of the third stacked body is located higher than an upper surface of the second gate electrode.

15. The device according to claim 10, further comprising:

an insulating layer integrally provided on the third stacked body and on the transistor, wherein the upper surface of the insulating layer located on the third stacked body is coplanar with the upper surface of the insulating layer located on the transistor.

16. The device according to claim 10, wherein the third layer is provided between the substrate and the fourth layer.

17. The device according to claim 1, wherein the second stacked body includes a plurality of insulating portions, the insulating portions including a same material as the material of the second layers and the fourth layer.

18. The device according to claim 1, wherein the second stacked body includes a semiconductor film provided in the second stacked body, and extending in a stacking direction of the electrode layers, and a charge storage film provided between the electrode layers and the semiconductor film.

19. A method of manufacturing a semiconductor memory device, the method comprising:

forming a first insulating portion and a second insulating portion on a substrate;

forming a first gate electrode and a second gate electrode, the first gate electrode being located on the first insulating portion, and the second gate electrode being located on a first portion of the substrate adjacent to the second insulating portion;

forming a plurality of third layers and a plurality of fourth layers integrally on the first gate electrode, the second gate electrode, and the substrate;

forming a stairs shape in the third layers and the fourth layers so as to form a first stacked body, a second stacked body and a third stacked body, the third stacked body being located on the first gate electrode, the second stacked body being located on a second portion of the substrate, the first stacked body being located on a third portion of the substrate, a number of stacked layers of the second stacked body being larger than a number of stacked layers of the third stacked body, and removing the third layers and the fourth layers formed on the second gate electrode;

forming an insulating layer on the first stacked body, the second stacked body, the third stacked body, and the second gate electrode; and planarizing an upper surface of the insulating layer.

* * * * *